United States Patent
Aikawa et al.

(10) Patent No.: US 10,311,929 B2
(45) Date of Patent: Jun. 4, 2019

(54) RESISTANCE CHANGE MEMORY

(71) Applicants: TOSHIBA MEMORY CORPORATION, Minato-ku, Tokyo (JP); SK HYNIX INC., Icheon-si, Gyeonggi-do (KR)

(72) Inventors: Hisanori Aikawa, Seoul (KR); Tatsuya Kishi, Seongnam-si (KR); Keisuke Nakatsuka, Seoul (KR); Satoshi Inaba, Seongnam-si (KR); Masaru Toko, Seoul (KR); Keiji Hosotani, Seoul (KR); Jae Yun Yi, Incheon-si (KR); Hong Ju Suh, Suwon-si (KR); Se Dong Kim, Yeoju-si (KR)

(73) Assignees: TOSHIBA MEMORY CORPORATION, Tokyo (JP); SK HYNIX INC., Icheon-si, Gyeonggi-do (KR)

(*) Notice: Subject to any disclaimer, the term of this patent is extended or adjusted under 35 U.S.C. 154(b) by 0 days.

(21) Appl. No.: 15/835,988

(22) Filed: Dec. 8, 2017

(65) Prior Publication Data

US 2018/0102156 A1 Apr. 12, 2018

Related U.S. Application Data

(63) Continuation of application No. PCT/IB2016/051435, filed on Mar. 14, 2016.
(Continued)

(51) Int. Cl.
  *G11C 11/16* (2006.01)
  *G11C 8/08* (2006.01)
(Continued)

(52) U.S. Cl.
  CPC .......... *G11C 11/1673* (2013.01); *G11C 5/063* (2013.01); *G11C 8/08* (2013.01);
  (Continued)

(58) Field of Classification Search
  CPC .................................................. G11C 2213/79
  (Continued)

(56) References Cited

U.S. PATENT DOCUMENTS 7,339,814 B2 * 3/2008 Happ ................. G11C 13/0004
                                                       257/E27.004
7,932,572 B2    4/2011 Tsujiuchi
(Continued)

FOREIGN PATENT DOCUMENTS

JP    2005019457 A    1/2005
JP    2006303150 A    11/2006
(Continued)

OTHER PUBLICATIONS

International Search Report (ISR) and Written Opinion dated Jun. 7, 2016 issued in International Application No. PCT/IB2016/051435.

*Primary Examiner* — Min Huang
(74) *Attorney, Agent, or Firm* — Holtz, Holtz & Volek PC

(57) ABSTRACT

According to an embodiment, a resistance change memory includes a semiconductor substrate, a transistor having a control terminal, a first terminal and a second terminal, the transistor provided on the semiconductor substrate, an insulating layer covering the transistor, a first conductive line connected to the first terminal and provided on the insulating layer, a second conductive line provided on the insulating layer, and a resistance change element connected between the second terminal and the second conductive line. The first conductive line has a width greater than a width of the second conductive line in a direction in which the first and second conductive lines are arranged.

7 Claims, 21 Drawing Sheets

Related U.S. Application Data

(60) Provisional application No. 62/173,779, filed on Jun. 10, 2015.

(51) Int. Cl.

| | | |
|---|---|---|
| *G11C 8/12* | (2006.01) | |
| *G11C 13/00* | (2006.01) | |
| *H01L 43/08* | (2006.01) | |
| *H01L 45/00* | (2006.01) | |
| *H01L 27/22* | (2006.01) | |
| *H01L 27/24* | (2006.01) | |
| *G11C 5/06* | (2006.01) | |

(52) U.S. Cl.
CPC ............ *G11C 8/12* (2013.01); *G11C 11/161* (2013.01); *G11C 11/1653* (2013.01); *G11C 11/1655* (2013.01); *G11C 11/1657* (2013.01); *G11C 13/0023* (2013.01); *G11C 13/0026* (2013.01); *G11C 13/0028* (2013.01); *H01L 27/228* (2013.01); *H01L 27/2436* (2013.01); *H01L 27/2463* (2013.01); *H01L 43/08* (2013.01); *H01L 45/06* (2013.01); *H01L 45/1233* (2013.01); *H01L 45/16* (2013.01); *H01L 45/1675* (2013.01); *G11C 2213/79* (2013.01); *G11C 2213/82* (2013.01)

(58) Field of Classification Search
USPC .......................................................... 365/148
See application file for complete search history.

(56) References Cited

U.S. PATENT DOCUMENTS

| | | |
|---|---|---|
| 8,351,253 B2 | 1/2013 | Hidaka |
| 2002/0172073 A1 | 11/2002 | Hidaka |
| 2004/0257865 A1 | 12/2004 | Honjo et al. |
| 2005/0122768 A1* | 6/2005 | Fukumoto ............. B82Y 10/00 365/158 |
| 2008/0049487 A1* | 2/2008 | Yoshimura ............. G11C 11/22 365/148 |
| 2009/0323396 A1 | 12/2009 | Inaba |
| 2011/0215382 A1* | 9/2011 | Asao ....................... H01L 29/82 257/252 |
| 2011/0305068 A1* | 12/2011 | Kitagawa ........... G11C 13/0026 365/148 |
| 2012/0243296 A1* | 9/2012 | Watanabe ............... G11C 11/16 365/148 |

FOREIGN PATENT DOCUMENTS

| | | |
|---|---|---|
| JP | 2009194210 A | 8/2009 |
| JP | 2010009659 A | 1/2010 |
| JP | 2012074130 A | 4/2012 |
| JP | 2012204399 A | 10/2012 |

* cited by examiner

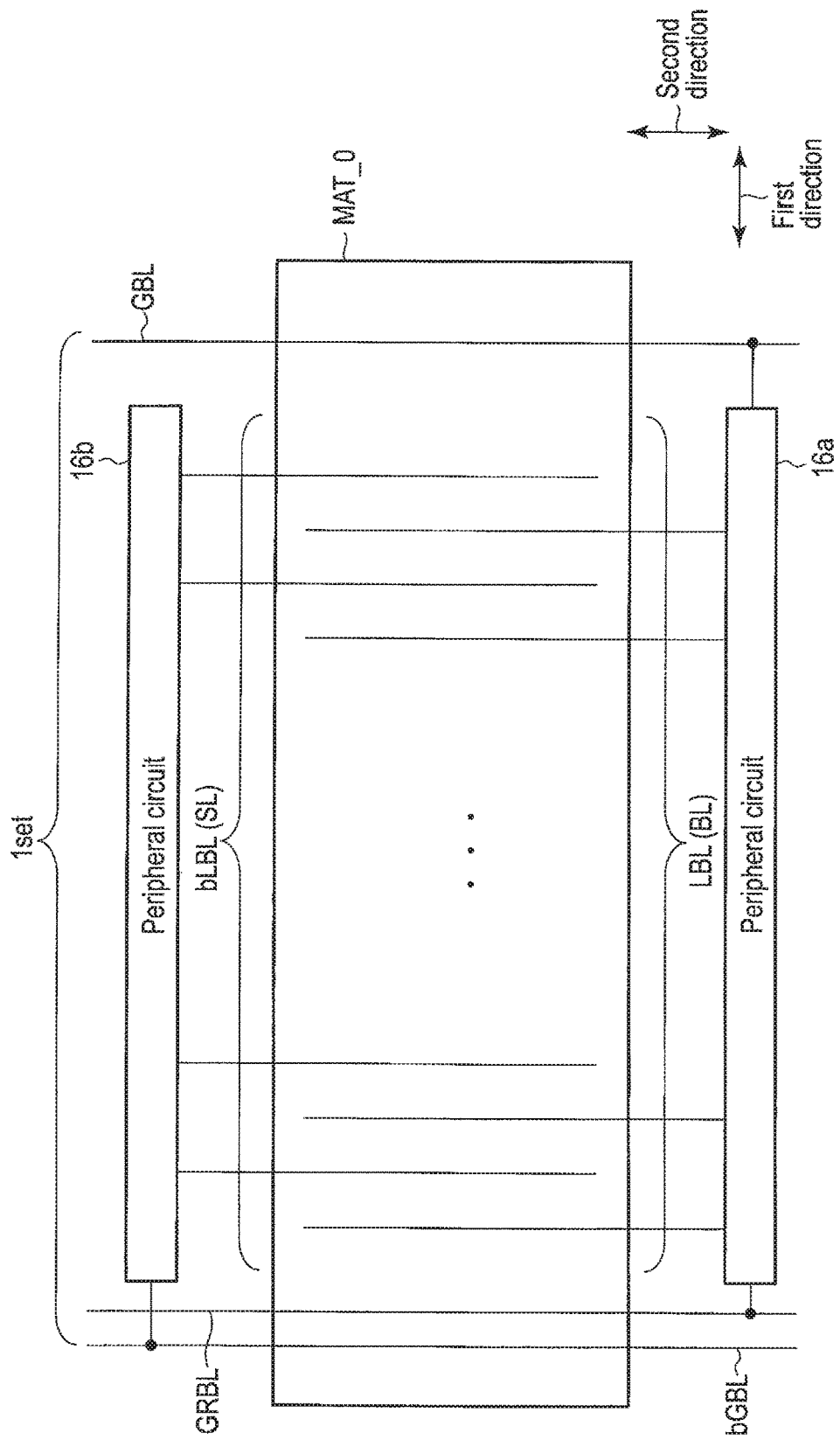
F I G. 2

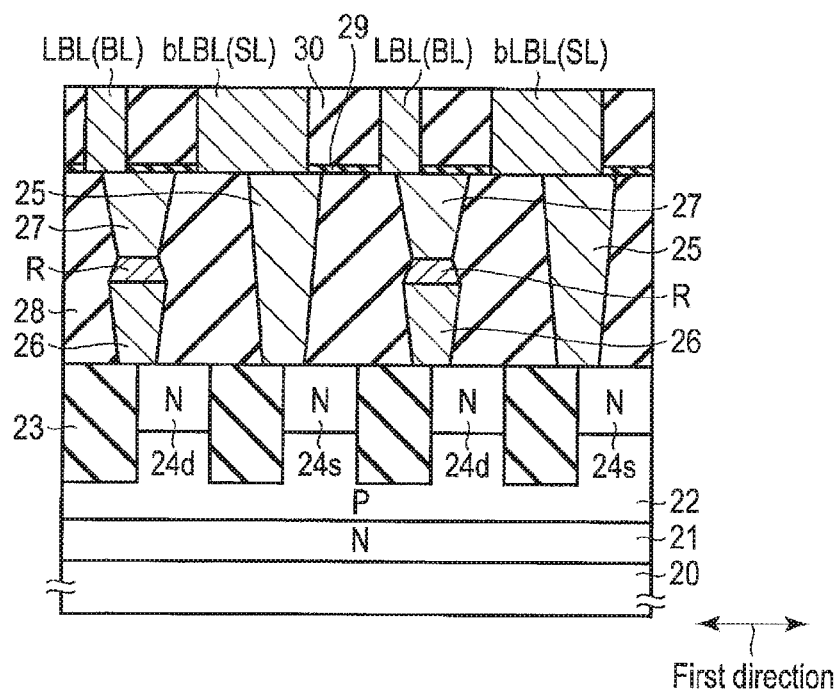
F I G. 19
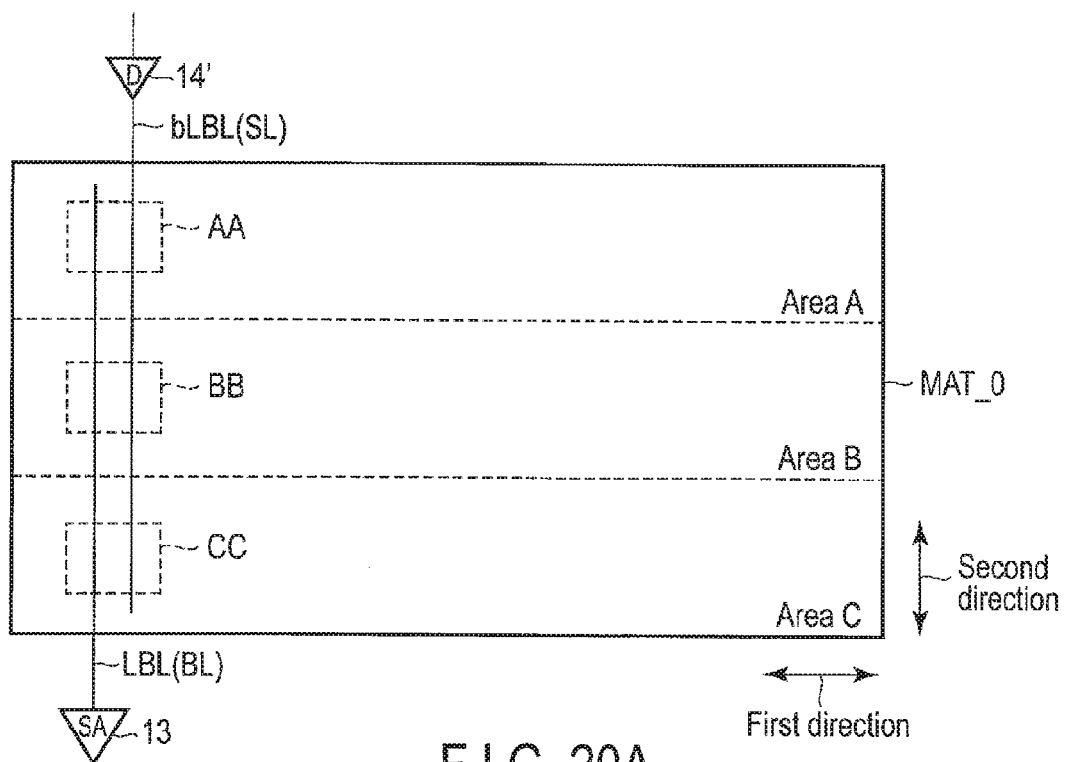
F I G. 20A

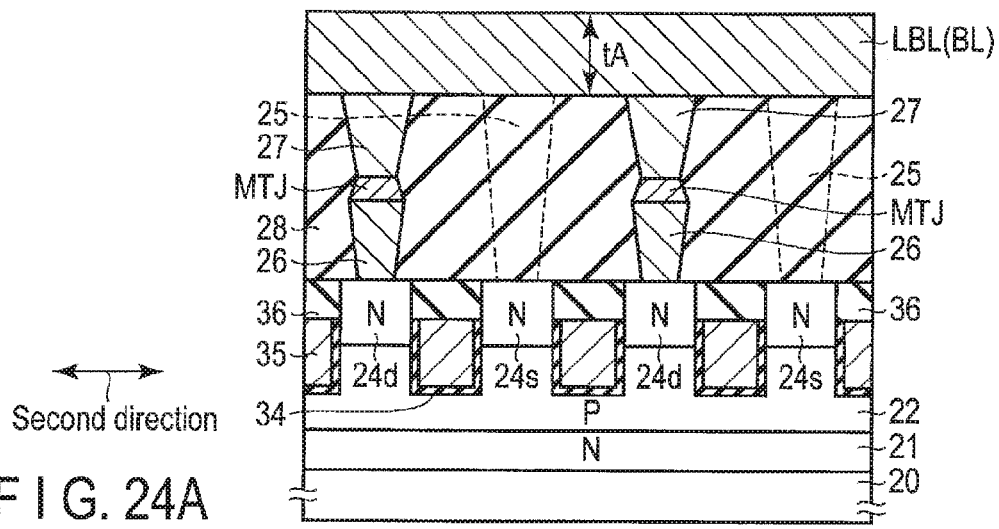
F I G. 24A
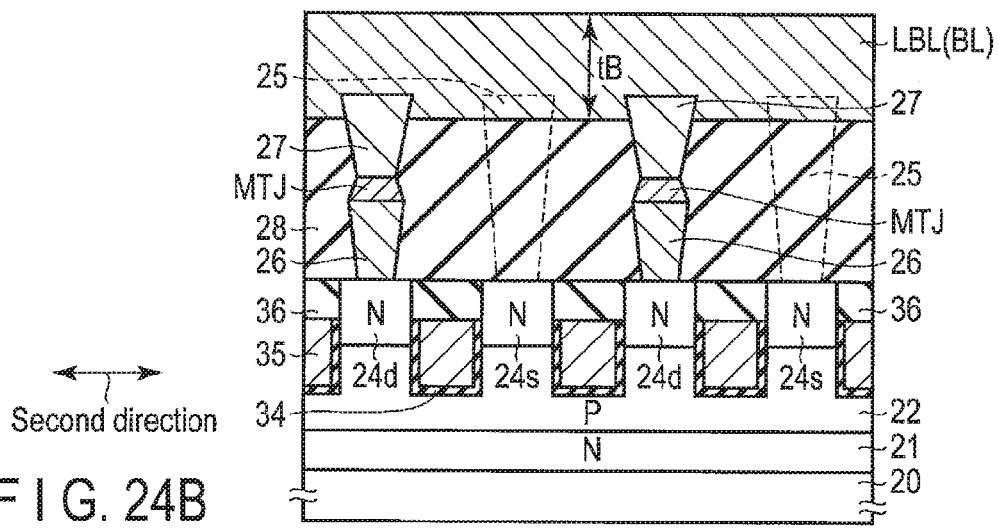
F I G. 24B
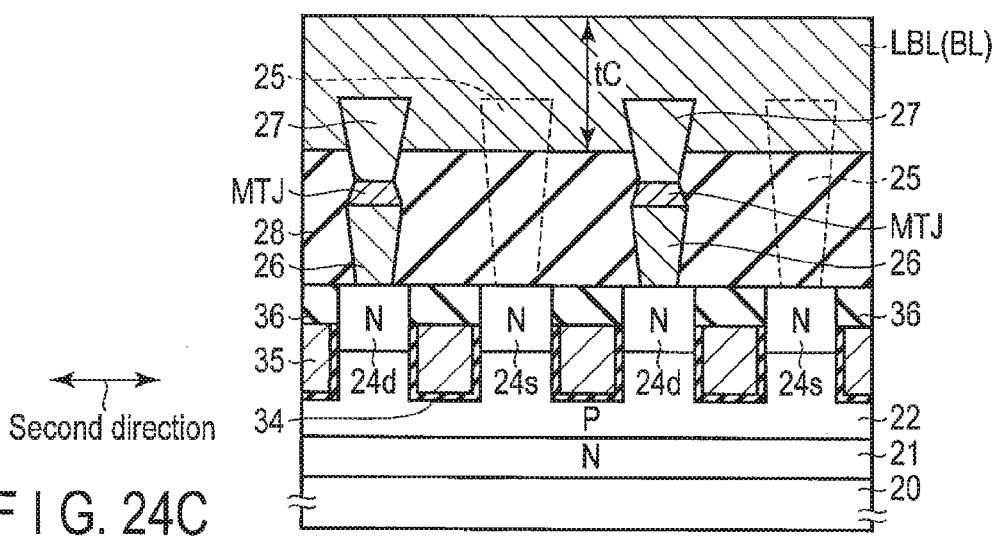
F I G. 24C

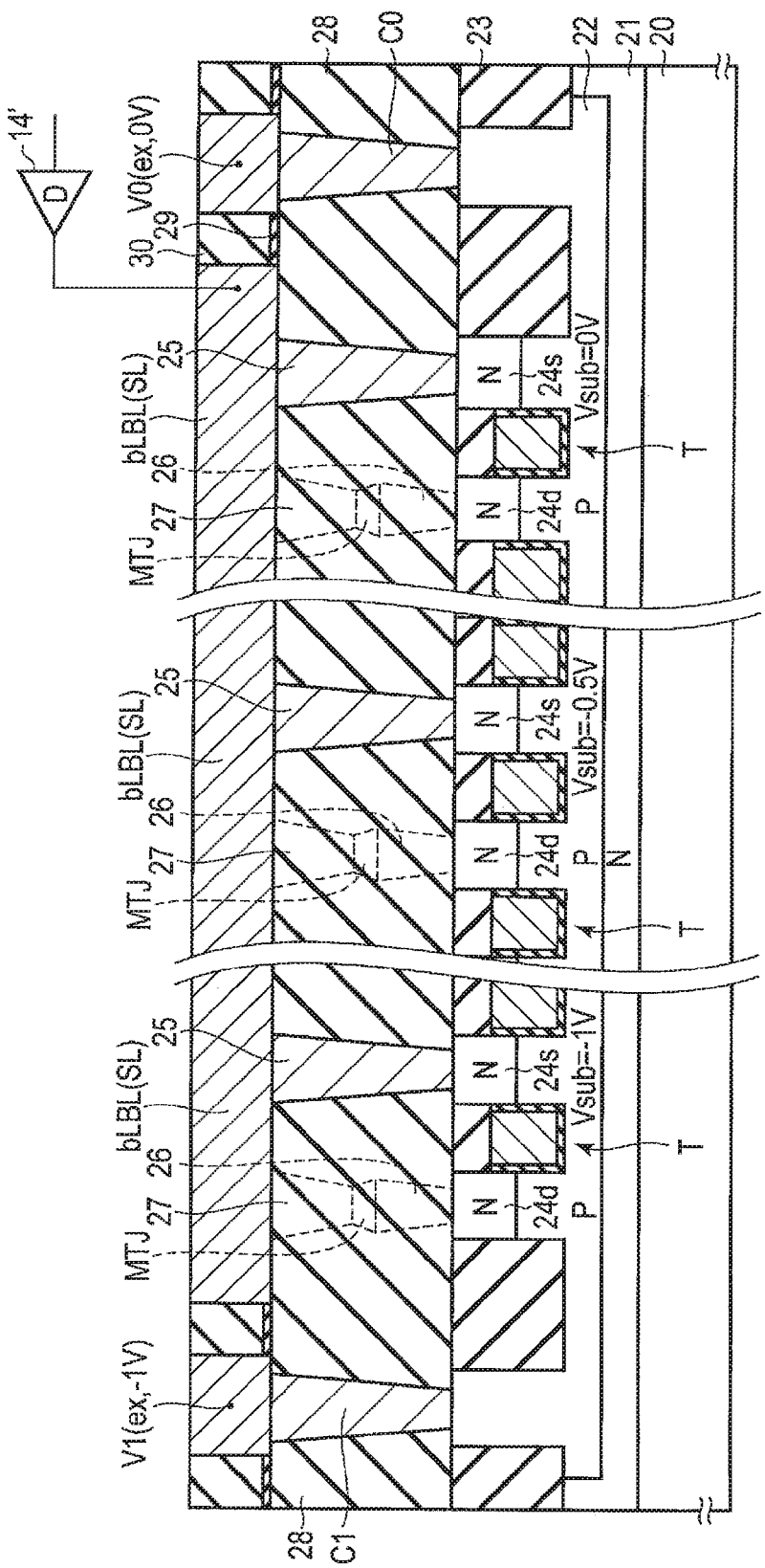
F I G. 26

| Address | Read Potential of selected word line | Write Potential of selected word line |
|---|---|---|
| A00~Axx | Vr0 | Vw0 |
| Axx+1~Ayy | Vr1 | Vw1 |
| Ayy+1~Azz | Vr2 | Vw2 |

※Vr0＞Vr1＞Vr2 , Vw0＞Vw1＞Vw2

RESISTANCE CHANGE MEMORY

CROSS-REFERENCE TO RELATED APPLICATIONS

This application is a Continuation Application of PCT Application No. PCT/IB2016/051435, field Mar. 14, 2016 and based upon and claiming the benefit of priority from U.S. Provisional Application No. 62/173,779, filed Jun. 10, 2015, the entire contents of all of which are incorporated herein by reference.

FIELD

Embodiments described herein relate generally to a resistance change memory.

BACKGROUND

A memory cell of a resistance change memory, for example, a spin torque transfer magnetic random access memory (STT-MRAM) comprises a select transistor and a resistance change element which are connected in series, and is connected between a bit line and a source line. With such a resistance change memory, when a resistance of the source line is increased as a result of miniaturization of the memory cell, a phenomenon in which a source potential of the select transistor is varied according to the position of the memory cell occurs during a read/write.

BRIEF DESCRIPTION OF THE DRAWINGS

FIG. 2 is a diagram showing an example of a block.
FIGS. 13 to 19 are sectional views showing an example of a method of manufacturing the device of FIGS. 8, 9A, and 9B.
FIGS. 20A and 20B are plan views showing a device as a second embodiment.
FIGS. 24A, 24B, and 24C are sectional views taken along line XXIII-XXIII of FIG. 21.
FIG. 26 is a sectional view taken along line XXVI-XXVI of FIG. 25.

DETAILED DESCRIPTION

In general, according to an embodiment, a resistance change memory comprises: a semiconductor substrate; a transistor having a control terminal, a first terminal and a second terminal, the transistor provided on the semiconductor substrate; an insulating layer covering the transistor; a first conductive line connected to the first terminal and provided on the insulating layer; a second conductive line provided on the insulating layer; and a resistance change element connected between the second terminal and the second conductive line. The first conductive line has a width greater than a width of the second conductive line in a direction in which the first and second conductive lines are arranged.

EMBODIMENTS

(1) Resistance Change Memory

Figure 1:
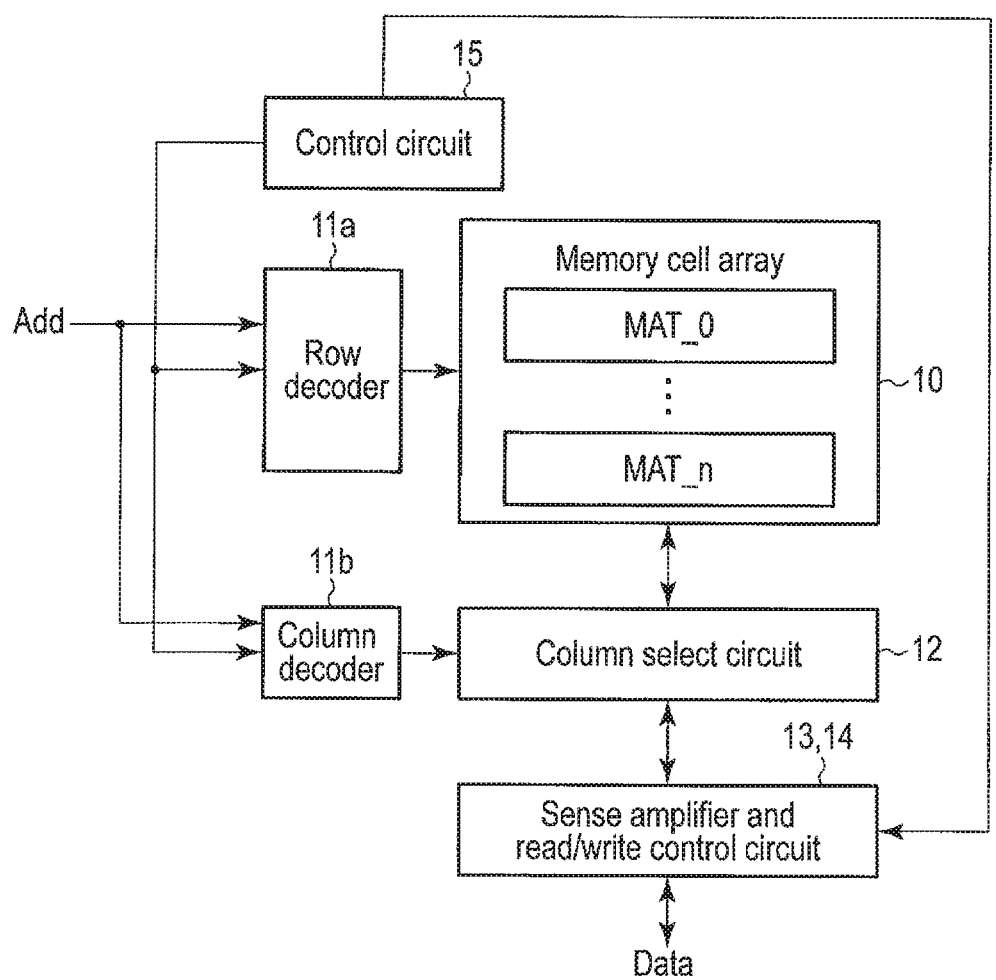
FIG. 1 is a diagram showing an example of a resistance change memory.

FIG. 1 shows an example of a resistance change memory.
A memory cell array 10 includes a plurality of blocks MAT_0, ..., MAT_n (where n is a natural number greater than or equal to 1). Each of the plurality of blocks MAT_0, ..., MAT_n comprises a plurality of memory cells. Each of the plurality of memory cells comprises a resistance change element and a select transistor.

The resistance change element is an element whose resistance is changed by a voltage, a current, heat, a magnetic field, etc., and includes elements such as a magnetoresistive element and a phase change element. The resistance of the resistance change element, that is, data stored in the resistance change element, is read by passing a read current to the resistance change element.

The select transistor has the function of, for example, supplying the read current to the resistance change element during a read. The select transistor is, for example, a field-effect transistor (FET).

A row decode 11a and a column decoder 11b perform random access to the plurality of memory cells within the plurality of blocks MAT_0, ..., MAT_n, on the basis of address signal Add.

A column select circuit 12 has the function of electrically connecting, for example, one of blocks MAT_0, ..., MAT_n and a sense amplifier 13 to each other, on the basis of a selection signal from the column decoder 11b.

A read/write control circuit 14 supplies the read current to a selected memory cell during a read. The value of the read current is changed by the resistance of the selected memory cell. That is, by detecting the read current, the sense amplifier 13 can determine data stored in the selected memory cell.

Also, when the resistance change element is an element whose resistance is changed by a write current, likewise a magnetoresistive element, for example, the read/write control circuit 14 supplies a write current to the selected memory cell during a write.

A control circuit 15 controls the operation of the row decoder 11a, the column decoder 11b, the sense amplifier 13, and the read/write control circuit 14.

FIG. 2 shows an example of the block.

Here, an example of block MAT_0 of FIG. 1 will be described. The other blocks are the same as block MAT_0.

Block MAT_0 comprises a plurality of sets, for example, 256 sets.

One set within block MAT_0 comprises a plurality of local bit lines LBL (bit lines BL) and a plurality of local bit lines bLBL (source lines SL). The plurality of local bit lines LBL and bLBL are aligned in a first direction, and extend in a second direction intersecting the first direction, respectively.

A peripheral circuit 16a is arranged at a first edge of block MAT_0 in the second direction. The peripheral circuit 16a is connected to the plurality of local bit lines LBL (bit lines BL). A peripheral circuit 16b is arranged at a second edge of block MAT_0 in the second direction. The peripheral circuit 16b is connected to the plurality of local bit lines bLBL (source lines SL).

Global bit lines GBL and bGBL, and global read bit line GRBL are arranged over the plurality of local bit lines LBL (bit lines BL) and the plurality of local bit lines bLBL (source lines SL).

Global bit line GBL extends in the second direction, and is connected to the peripheral circuit 16a. Global bit line bGBL extends in the second direction, and is connected to the peripheral circuit 16b. Global read bit line GRBL extends in the second direction, and is connected to the peripheral circuit 16a. A group of global bit line GBL, global bit line bGBL, and global read bit line GRBL is provided for each set.

Figure 3:
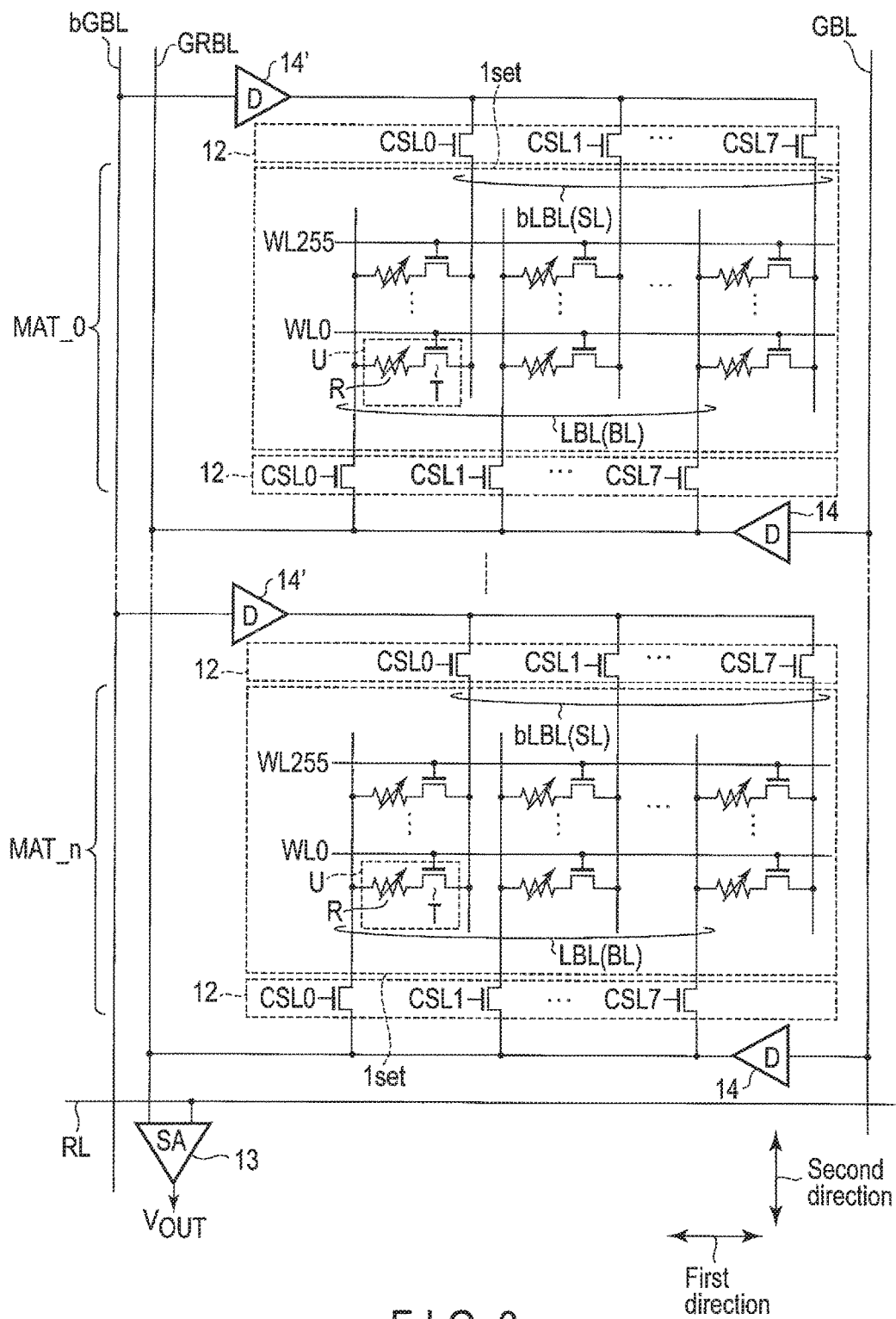
FIG. 3 is a diagram showing an example of a memory cell array.

FIG. 3 shows an example of a memory cell array.

Blocks MAT_0, . . . , MAT_n correspond to blocks MAT_0, . . . , MAT_n of FIG. 1. Each block has the layout shown in FIG. 2, for example.

Each block comprises memory cells (cell units) U each including resistance change element R and select transistor T connected in series.

A first edge on the side of resistance change element R in each memory cell U is connected to local bit line LBL (bit line BL). Local bit lines LBL (bit lines BL) are connected to the sense amplifier 13 via column select circuit (switch element) 12 and global read bit line GRBL. Further, local bit lines LBL (bit lines BL) are connected to the write control circuit (a driver) 14. The write control circuit (the driver) 14 is connected to global bit line GBL.

A second edge on the side of select transistor T of each memory cell U is connected to local bit line bLBL (source line SL). Local bit lines bLBL (source lines SL) are connected to a read/write control circuit (a driver) 14' via column select circuit (switch element) 12. The read/write control circuit (the driver) 14' is connected to global bit line bGBL.

In this case, one set comprises eight columns, that is, eight local bit lines LBL (bit lines BL) and eight local bit lines bLBL (source lines SL). Column select circuit 12 selects one of the eight columns on the basis of column select signals CSL0, . . . , CSL7. Also, one set comprises 256 rows, that is, 256 word lines WL0, . . . , WL 255. The sense amplifier 13 compares a signal from global read bit line GRBL with a signal from reference line RL, and outputs output signal $V_{OUT}$.

(2) Comparative Example

An example of a structure of the memory cell array will be described.

Figure 4:
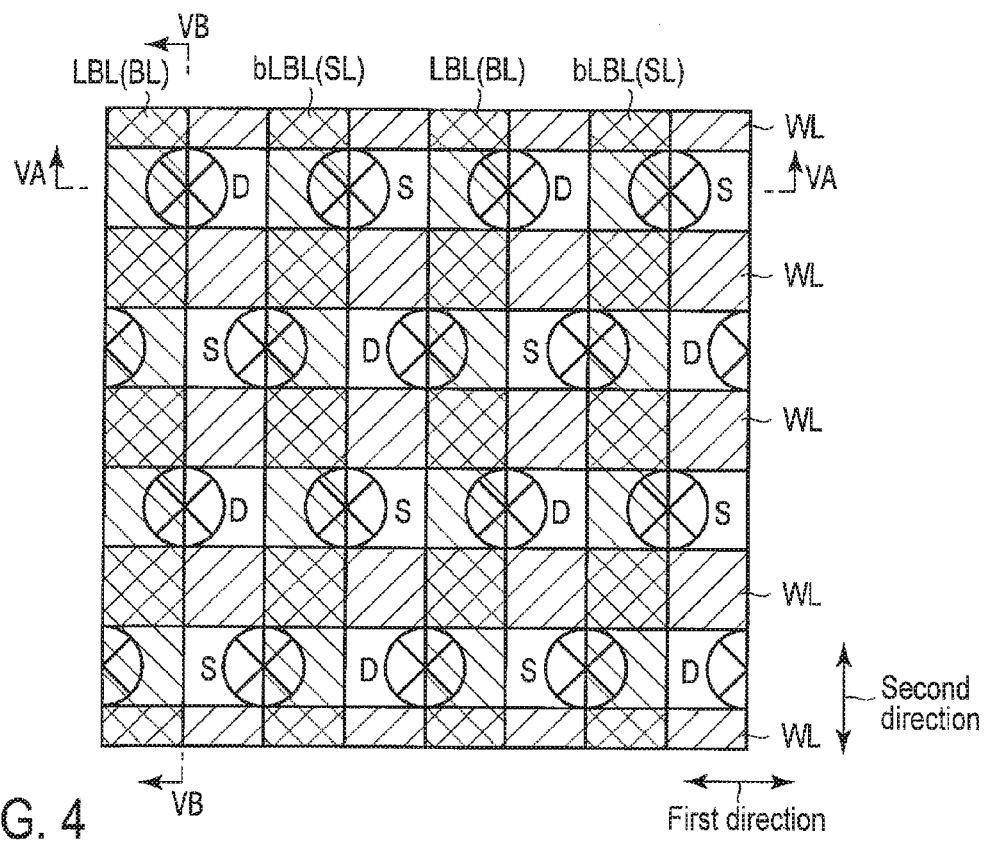
FIG. 4 is a plan view showing a device as a comparative example.
Figure 5A:
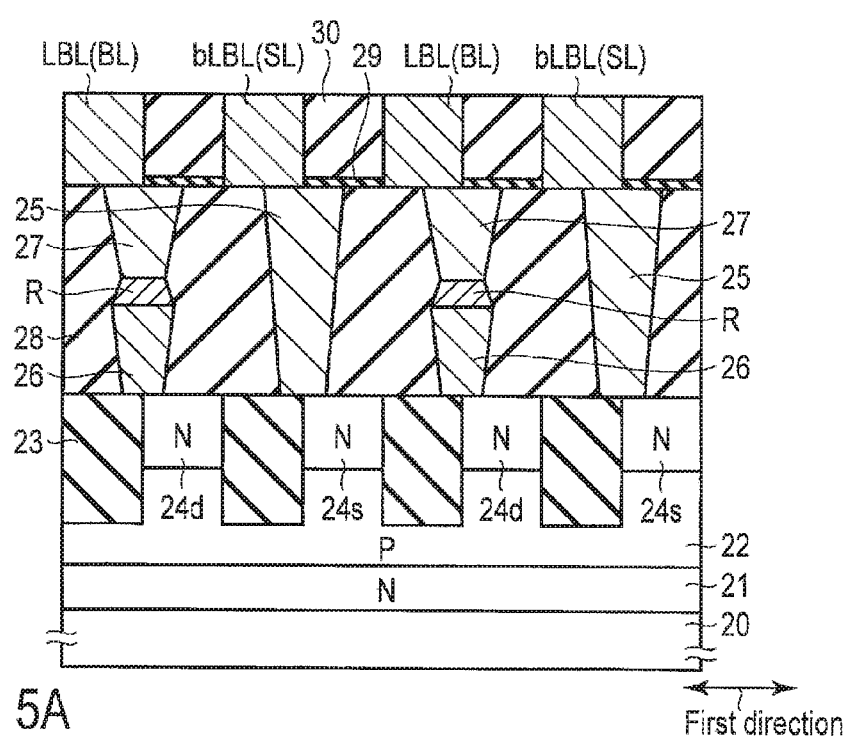
FIG. 5A is a sectional view taken along line VA-VA of FIG. 4.
Figure 5B:
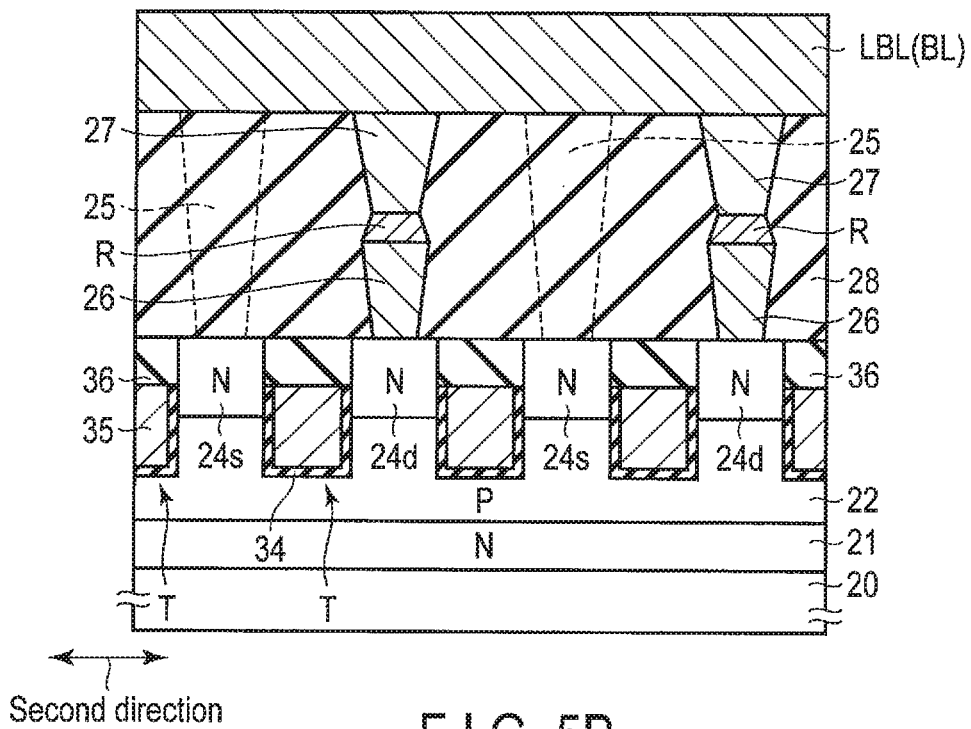
FIG. 5B is a sectional view taken along line VB-VB of FIG. 4.

FIG. 4 shows a device as a comparative example. FIG. 5A is a sectional view taken along line VA-VA of FIG. 4, and FIG. 5B is a sectional view taken along line VB-VB of FIG. 4.

A semiconductor substrate 20 is, for example, a silicon substrate. An N-type well region 21 and a P-type well region 22 are arranged within the semiconductor substrate 20. An element isolation insulating layer 23 is disposed within the P-type well region 22. The element isolation insulating layer 23 has a shallow trench isolation (ST1) structure.

An area surrounded by the element isolation insulating layer 23 is an active area. Select transistor T is arranged on the P-type well region 22 in the active area. Select transistor T comprises an N-type source region (S) 24s, an N-type drain region (D) 24d, and a gate electrode 35 disposed between the source and drain regions 24s and 24d.

The gate electrode 35 also serves as word line WL. A gate insulating layer 34 is disposed between the P-type well region 22 and the gate electrode 35. A cap insulating layer 36 covers an upper surface of the gate electrode 35. The gate electrode 35 has a buried gate structure which is buried in the P-type well region 22, for example.

An insulating layer 28 covers select transistor T. Local bit lines LBL (bit lines BL) and local bit lines bLBL (source lines SL) are disposed on the insulating layer 28.

Each of local bit line LBL (bit line BL) is connected to resistance change element R via a contact plug 27. Resistance change element R is connected to the N-type drain region 24d via contact plug 26. Local bit line bLBL (source line SL) is connected to the N-type source region 24s via contact plug 25.

Contact plugs 25, 26 and 27 include, for example, one of W, Ta, Ti, TaN, and TiN.

Insulating layers 29 and 30 are disposed between local bit line LBL (bit line BL) and local bit line bLBL (source line SL).

In the present case, while the source region (S) 24s and the drain region (D) 24d are N-type, they may be changed to P-type. In such a case, the source regions (S) 24s and the drain region (D) 24d may be formed in the N-type well.

Figure 6:
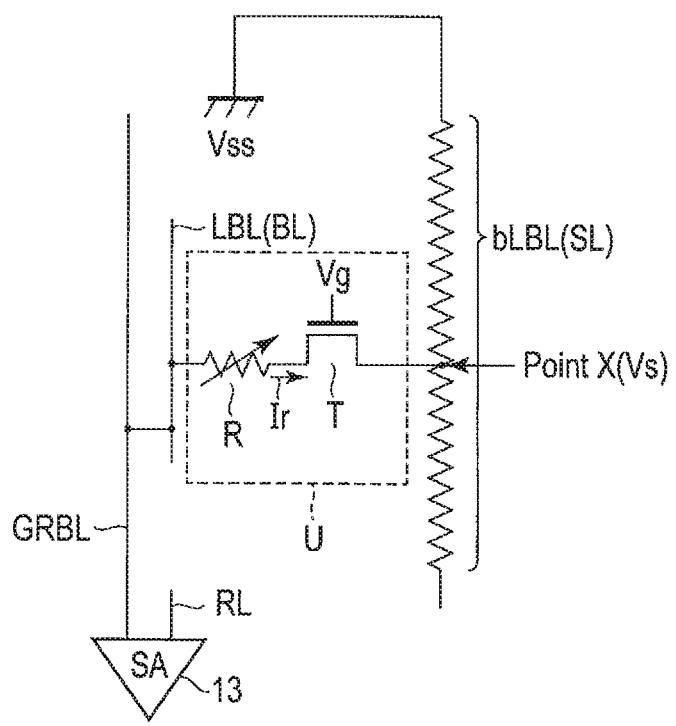
FIGS. 6 and 7 are illustrations showing an example of change in the potential of a source line during a read.
Figure 7:
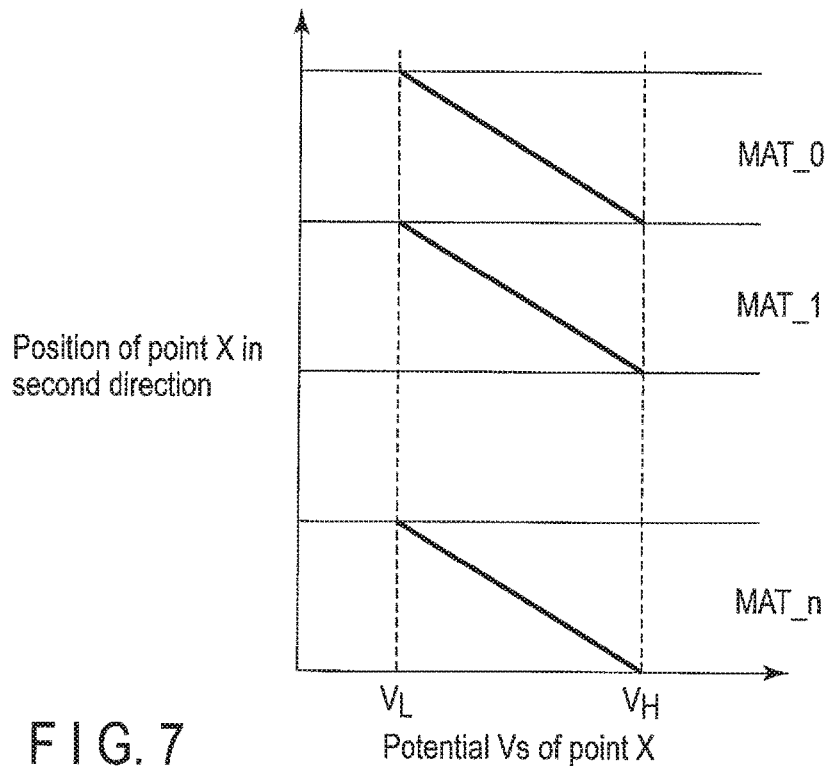

FIGS. 6 and 7 show an example of a change in the potential of the source line during a read.

In the resistance change memory shown in FIGS. 1 to 3, an equivalent circuit during a read is represented in a simplified way as shown in FIG. 6.

That is, the more memory cell (cell unit) U is miniaturized, the higher the resistance of local bit line bLBL (source line SL) becomes. In this case, for example, when read current Ir is passed to memory cell U during a read, according to the position of memory cell U (point X), a phenomenon in which source potential Vs of select transistor T is varied occurs.

For example, as shown in FIG. 7, according to the position of point X, the potential at point X (source potential Vs of select transistor T) is varied within the range of $V_L$ to $V_H$. However, it is assumed that $V_L < V_H$.

The above means that there are variations in a difference between gate potential Vg and source potential Vs of select transistor T depending on the position of memory cell U during a read, that is, there are variations in read current Ir which flows in memory cell U.

The variations cause read errors during a read. Also, the same can be said of when data is written to resistance change element R by a write current. That is, during a write, when variations in source potential Vs of select transistor T occur, variations in the write current occur, and this causes write errors.

(3) First Embodiment

Figure 8:
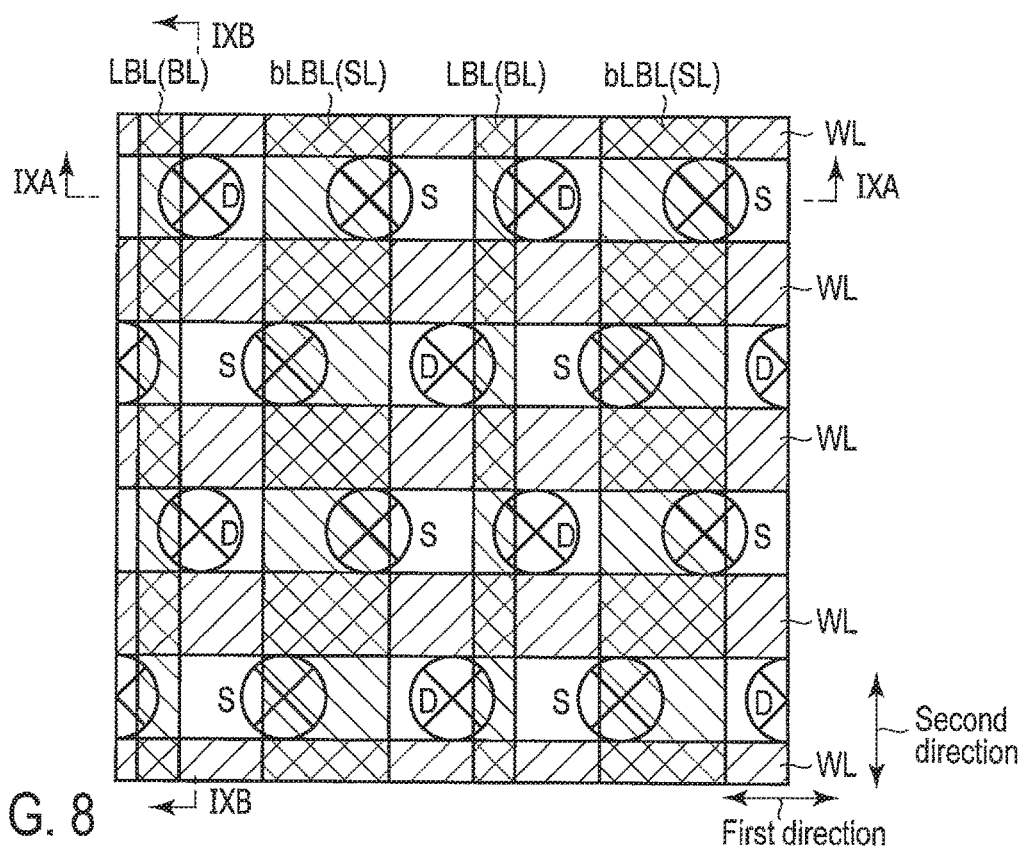
FIG. 8 is a plan view showing a device as a first embodiment.
Figure 9A:
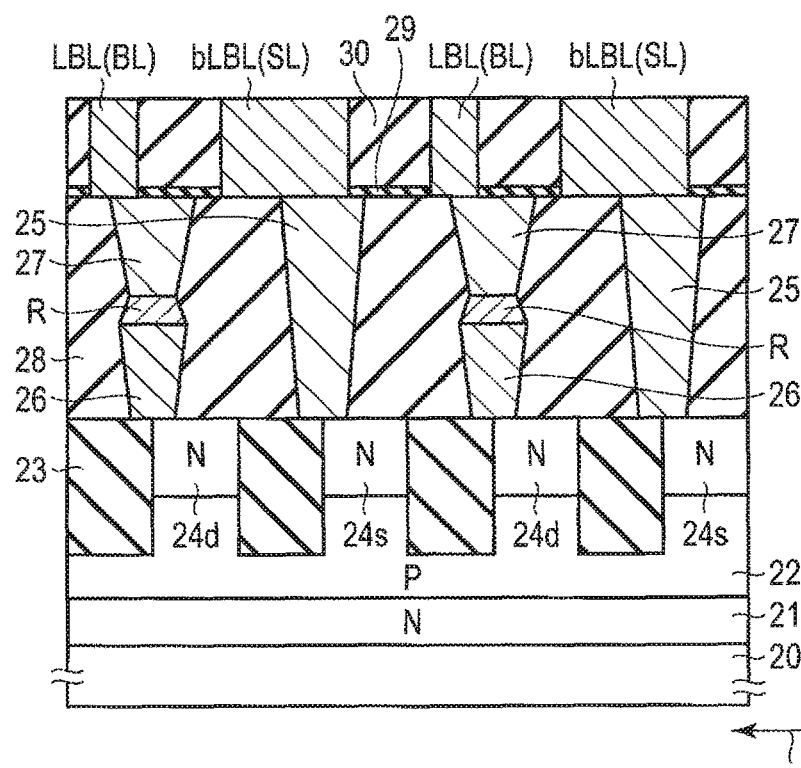
FIG. 9A is a sectional view taken along line IXA-IXA of FIG. 8.
Figure 9B:
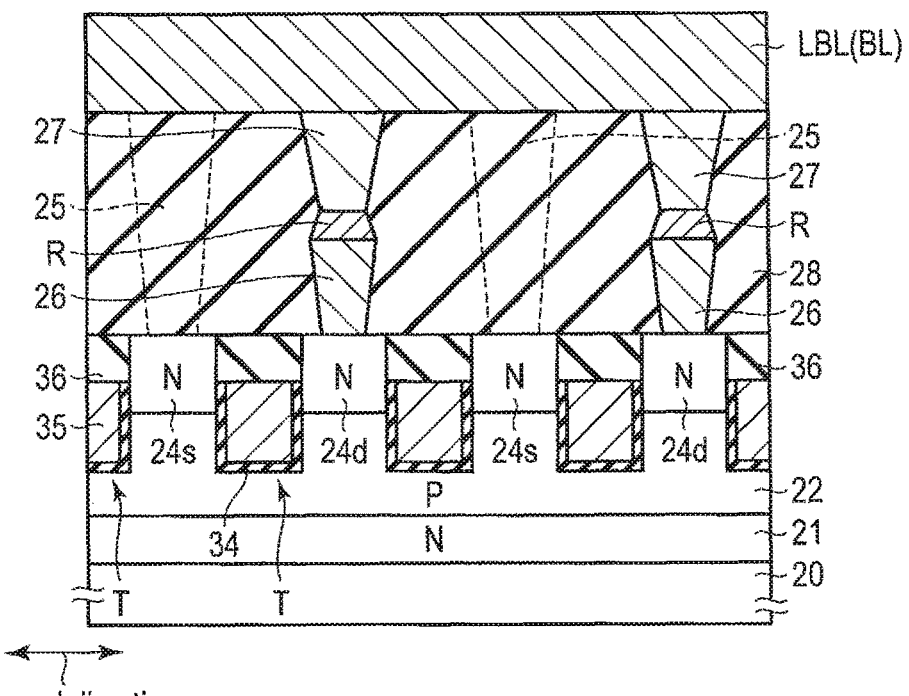
FIG. 9B is a sectional view taken along line IXB-IXB of FIG. 8.

FIG. 8 shows a device as a first embodiment. FIG. 9A is a sectional view taken along line IXA-IXA of FIG. 8, and FIG. 9B is a sectional view taken along line IXB-IXB of FIG. 8.

The first embodiment has the feature in the point that, as compared to the comparative example (FIGS. 6 and 7), the width of local bit line bLBL (source line SL) is greater than that of local bit line LBL (bit line BL) in the first direction in which local bit lines LBL (bit lines BL) and local bit lines bLBL (source lines SL) are aligned.

Since the other parts are the same as those of the comparative example, the same reference numbers are assigned to elements which are the same as those of the comparative example, and detailed explanation of them is omitted.

In the comparative example, the reason for having variations in the read/write current during a read/write is that the source potential of the select transistor is varied according to the position of the memory cell.

Hence, in the first embodiment, by increasing the width of local bit line bLBL (source line SL) to be greater than the width of local bit line LBL (bit line BL), the resistance of local bit line bLBL (source line SL) can be reduced.

Because of this, since variations in source potential Vs of select transistor T are reduced, read errors and write errors, etc., can be effectively prevented.

Figure 10:
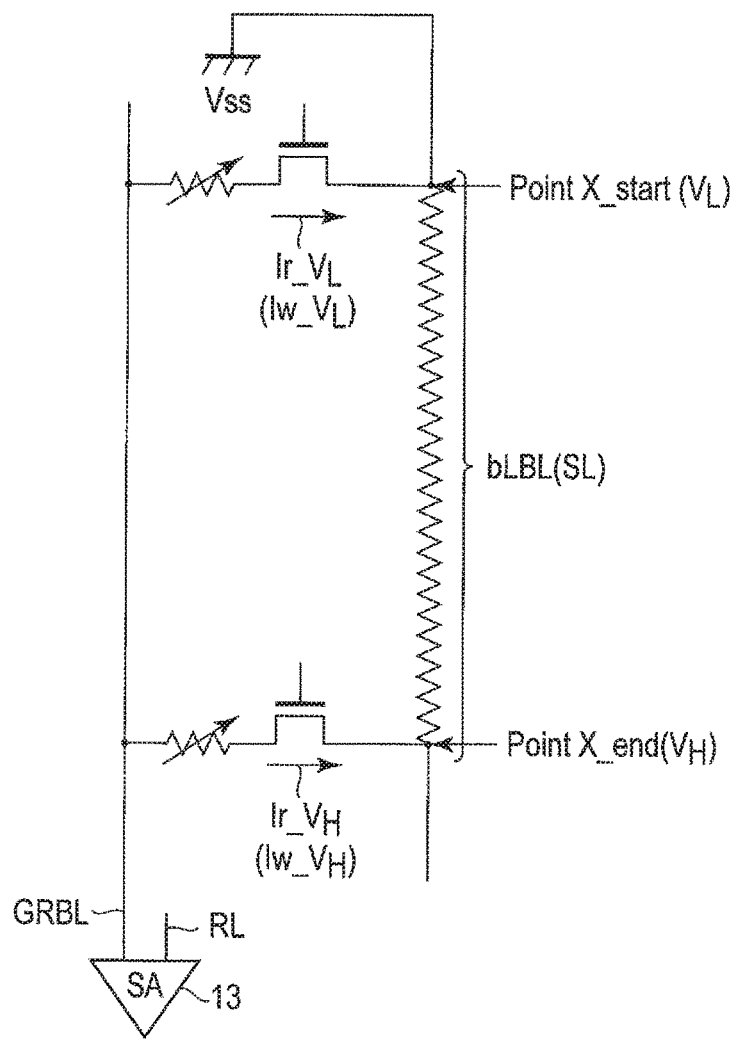
FIGS. 10 and 11 are illustrations showing change in the potential of a source line during a read.
Figure 11:
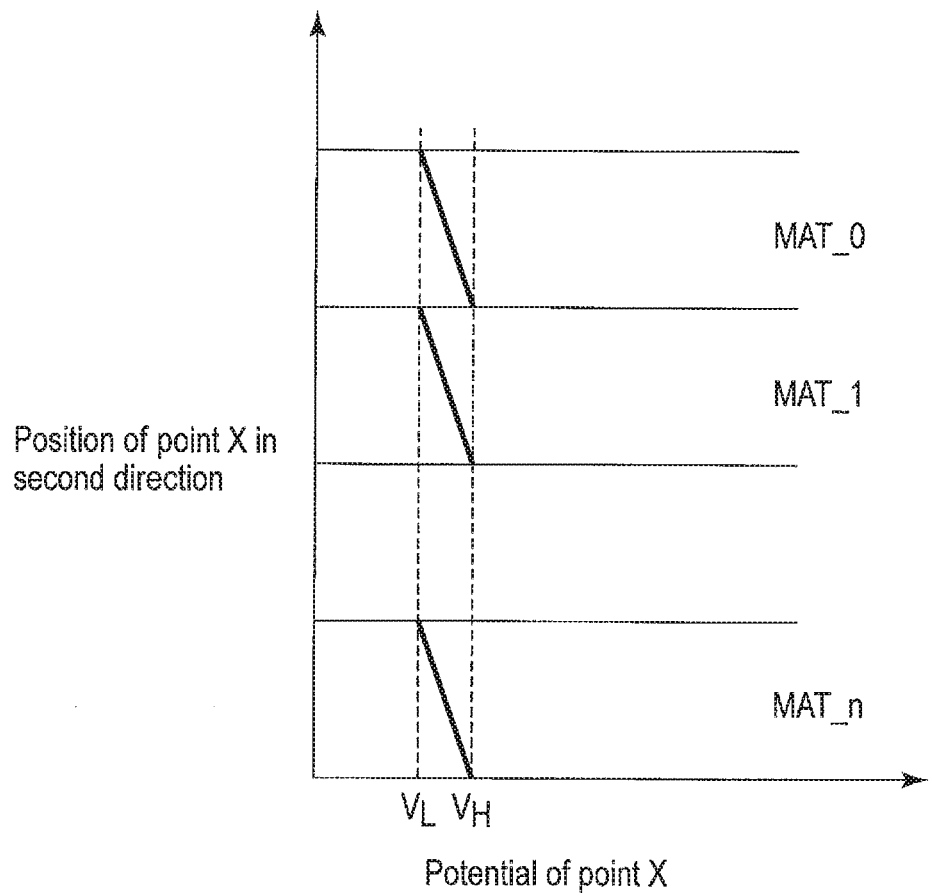

FIGS. 10 and 11 show an example of a change in the potential of the source line during a read.

According to the first embodiment, a difference between $V_L$ and $V_H$ can be made smaller than that in the comparative example.

Note that $V_L$ is source potential Vs of select transistor T of a memory cell which is connected to the starting point (Point X_start) of local bit line bLBL (source line SL), that is, a memory cell that is closest to a driver which supplies ground potential to local bit line bLBL (source line SL).

Also, $V_H$ is source potential Vs of select transistor T of a memory cell which is connected to the end point (Point X_end) of local bit line bLBL (source line SL), that is, a memory cell that is farthest from the driver which supplies the ground potential to local bit line bLBL (source line SL).

In this case, a difference between read current $Ir\_V_L$ which flows in the memory cell connected to Point X_start and read current $Ir\_V_H$ which flows in the memory cell connected to Point X_end can be reduced. Since this means that variation αr in the read current shown in FIG. 12 is reduced, for example, the read error can be reduced.

Similarly, a difference between write current $Iw\_V_L$ which flows in the memory cell connected to Point X_start and write current $Iw\_V_H$ which flows in the memory cell connected to Point X_end can be reduced. Since this means that variation αw in the write current shown in FIG. 12 is reduced, for example, the write error can be reduced.

Figure 12:
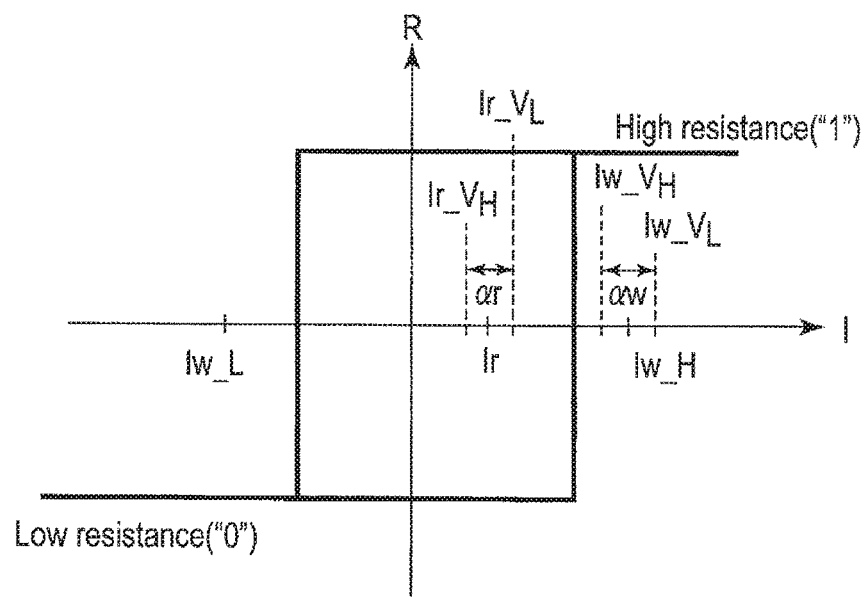
FIG. 12 is an illustration showing an advantage of improving a read error and a write error.

It should be noted that in FIG. 12, I represents the value of a current which is supplied to the memory cell, and R represents the resistance of the resistance change element within the memory cell. Ir represents the reference value of the read current, Iw_L represents the reference value of the write current when the resistance change element is changed to be of low resistance, and Iw_H represents the reference value of the write current when the resistance change element is changed to be of high resistance.

Further, $Ir\_V_L$, $Ir\_V_H$, $Iw\_V_L$, and $Iw\_V_H$ of FIG. 12 correspond to $Ir\_V_L$, $Ir\_V_H$, $Iw\_V_L$, and $Iw\_V_H$ of FIG. 10.

FIGS. 13 to 19 show a method of manufacturing the device of FIGS. 8, 9A, and 9B. Since the device of FIGS. 8, 9A, and 9B has the feature in the structure of local bit line LBL (bit line BL) and local bit line bLBL (source line SL), a method of manufacturing this structure will be described.

Figures 13, 14:
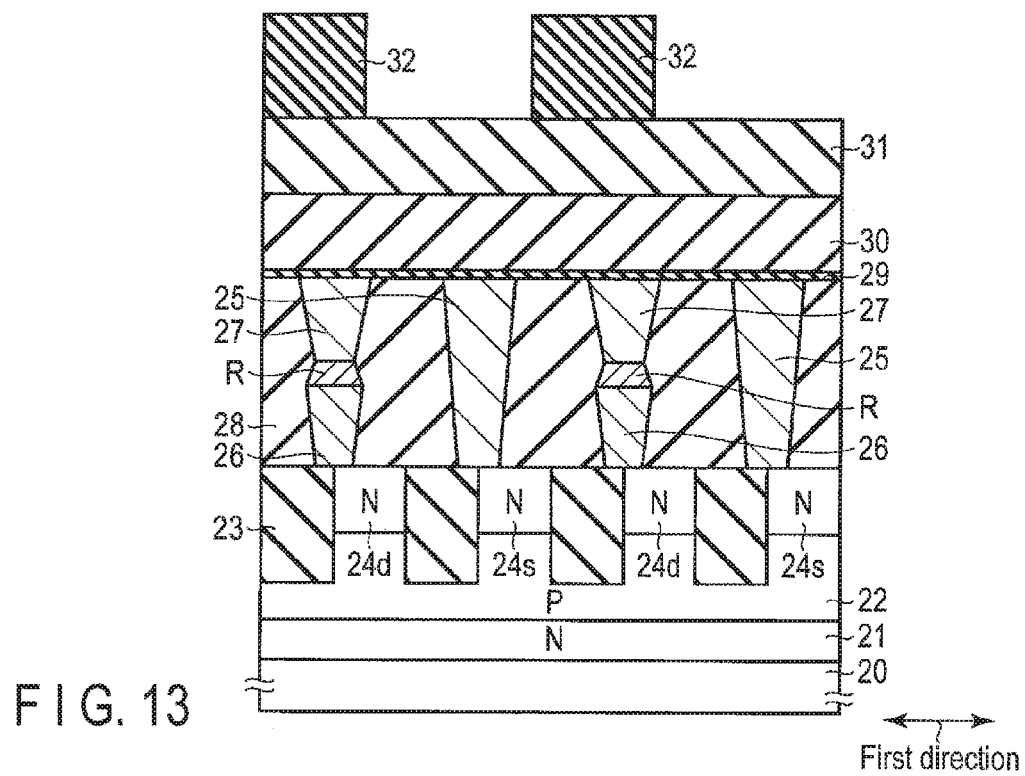

Firstly, as shown in FIG. 13, steps of forming a select transistor and a resistance change element on the semiconductor substrate 20, covering these with the insulating layer (for example, a silicon oxide layer) 28, and forming contact plugs 25 and 28 are executed by a general semiconductor process. In FIG. 13, the same elements as those shown in FIGS. 8, 9A, and 9B are given the same reference numbers.

After the above steps, insulating layer (for example, a silicon nitride layer) 29 as an etching stopper is formed on insulating layer 28. Following that, insulating layer (for example, a silicon oxide layer) 30 and insulating layer (for example, a silicon nitride layer) 31 are formed on insulating layer 29.

Further, insulating layer (for example, a silicon oxide layer) 32 as a hard mask is formed on insulating layer 31.

Next, as shown in FIG. 14, insulating layer 32 is shrunk by, for example, isotropic etching using a chemical solution. As a result, width W1 of insulating layer 32 can be set to be smaller than a minimum processing width obtained by, for example, photolithography. Width W1 of insulating layer 32 turns out to be a width of a local bit line (a bit line) to be described later.

Figure 15:
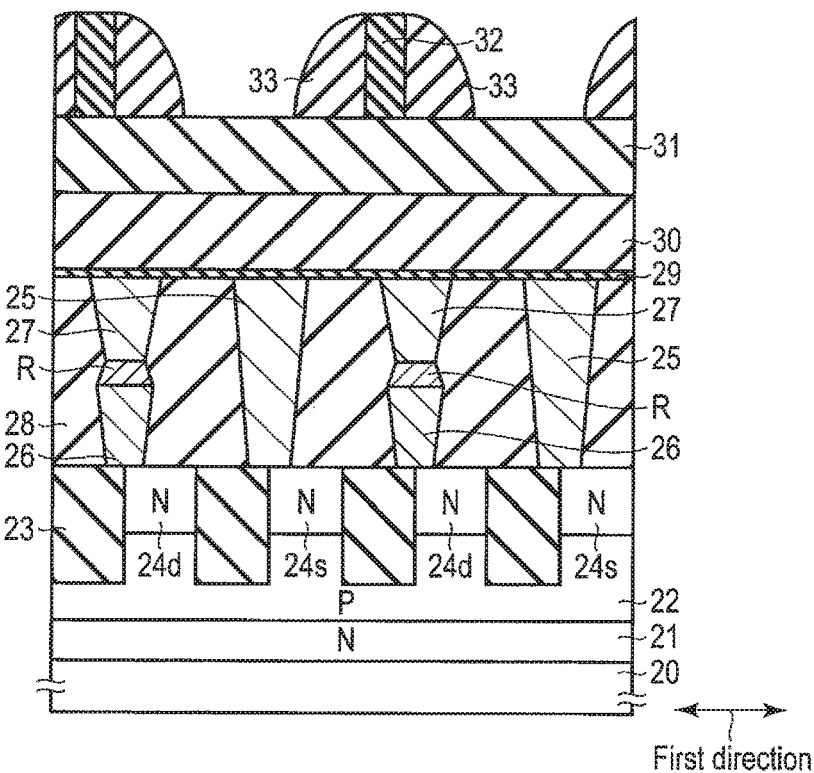
Figure 16:
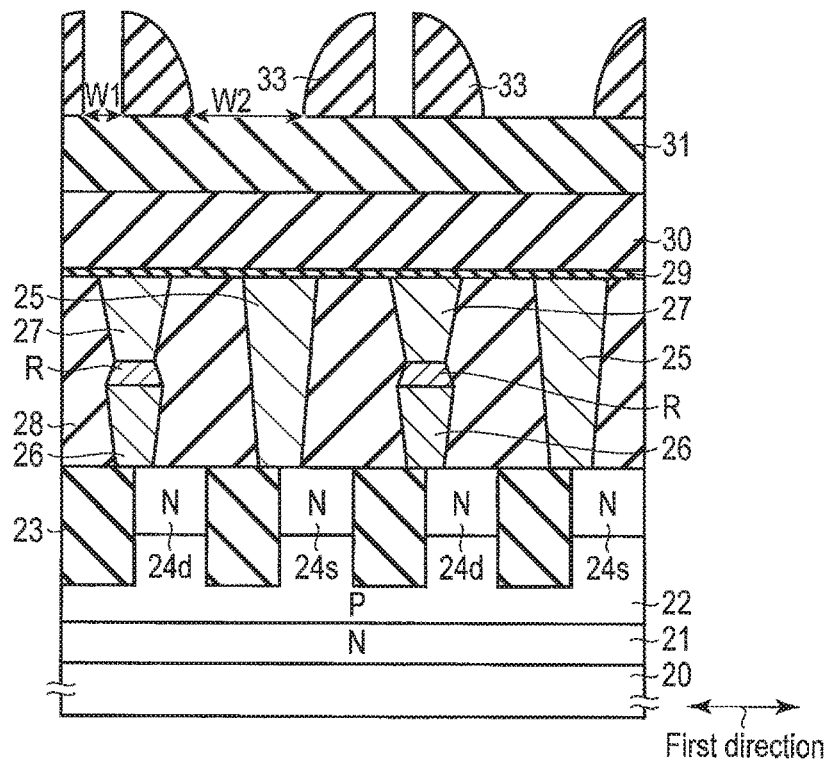
Figure 17:
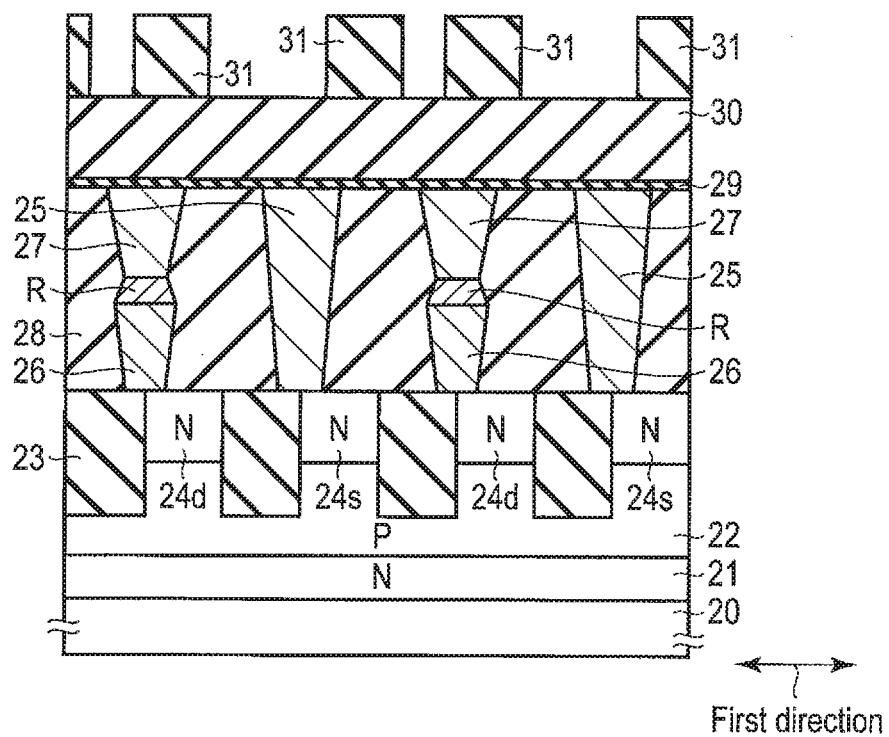

Next, as shown in FIG. 15, insulating layer (for example, a silicon nitride layer) 33 as a sidewall is formed on a sidewall of insulating layer 32. Further, as insulating layer 32 is selectively removed, as shown in FIG. 16, two types of width, i.e., width W1 and width W2, are formed by insulating layer 33. After that, when insulating layer 31 is etched by reactive ion etching (RIE) with insulating layer 33 used as a mask, a structure shown in FIG. 17 is obtained.

Figure 18:
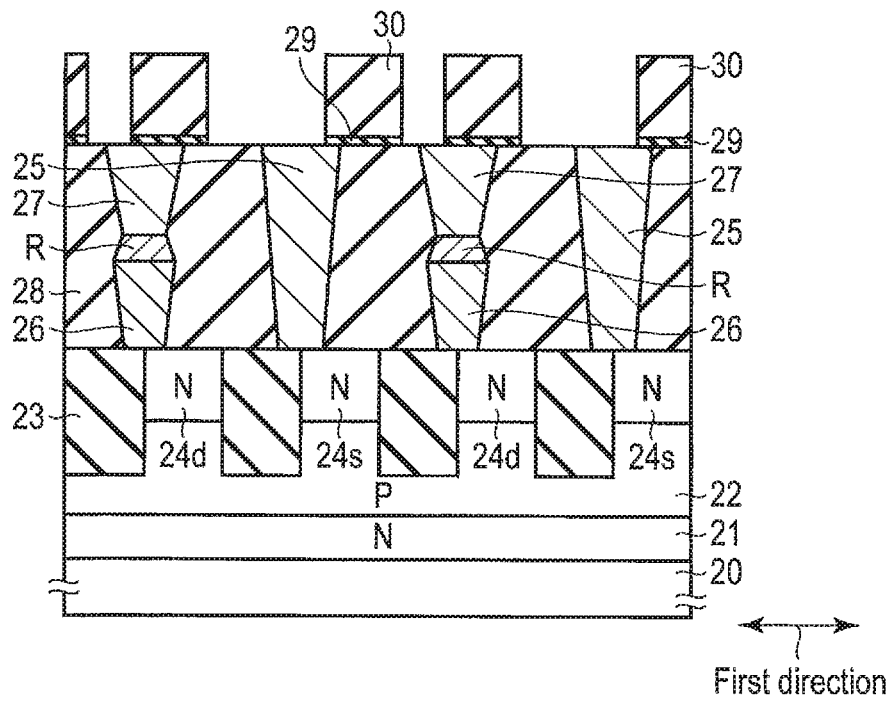

Further, when insulating layer 30 is etched by the RIE with insulating layer 31 used as a mask, a structure shown in FIG. 18 is obtained. In this etching, insulating layer 29 serves as an etching stopper. Accordingly, insulating layer 28 will not be etched by this etching. After that, insulating layer 29 as the etching stopper is selectively removed.

Lastly, as shown in FIG. 19, a conductive layer which fills space in insulating layers 29 and 30 is formed on insulating layer 28. Further, by chemical mechanical polishing (CMP), for example, the conductive layer is filled in the space in insulating layers 29 and 30.

As a result, local bit line LBL (bit line BL) having width W1 and local bit line bLBL (source line SL) having width W2 are formed, respectively.

By the above steps, the device of FIGS. 8, 9A, and 9B is completed.

According to the first embodiment, a phenomenon in which variations occur in the read/write current that a select transistor can pass can be restrained by increasing the width of local bit line bLBL (source line SL). Accordingly, read errors and write errors, etc., can be prevented.

(4) Second Embodiment

Figure 20B:
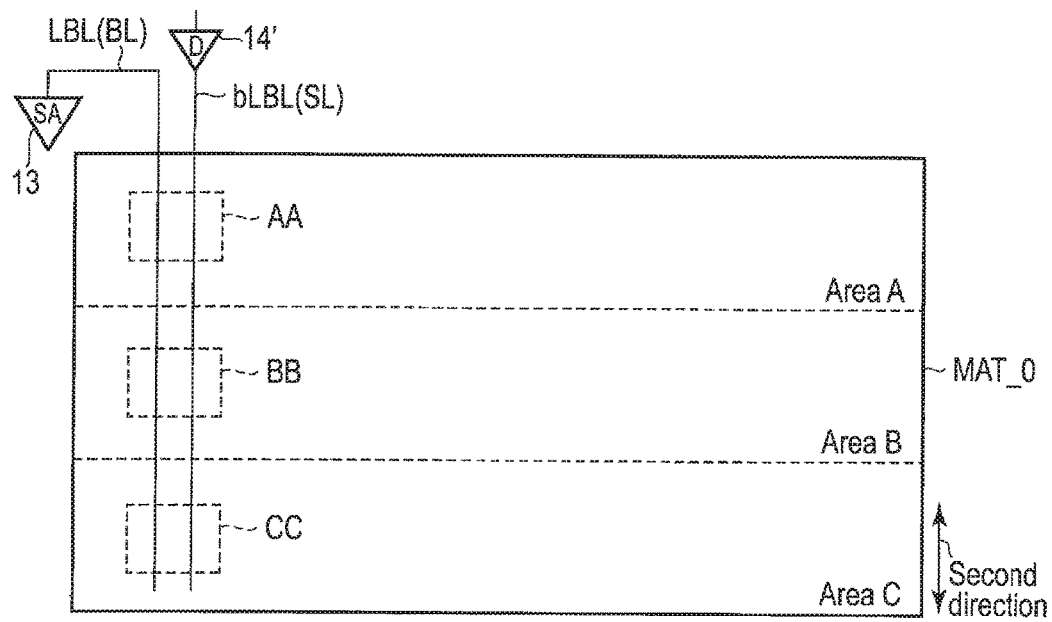
Figure 21:
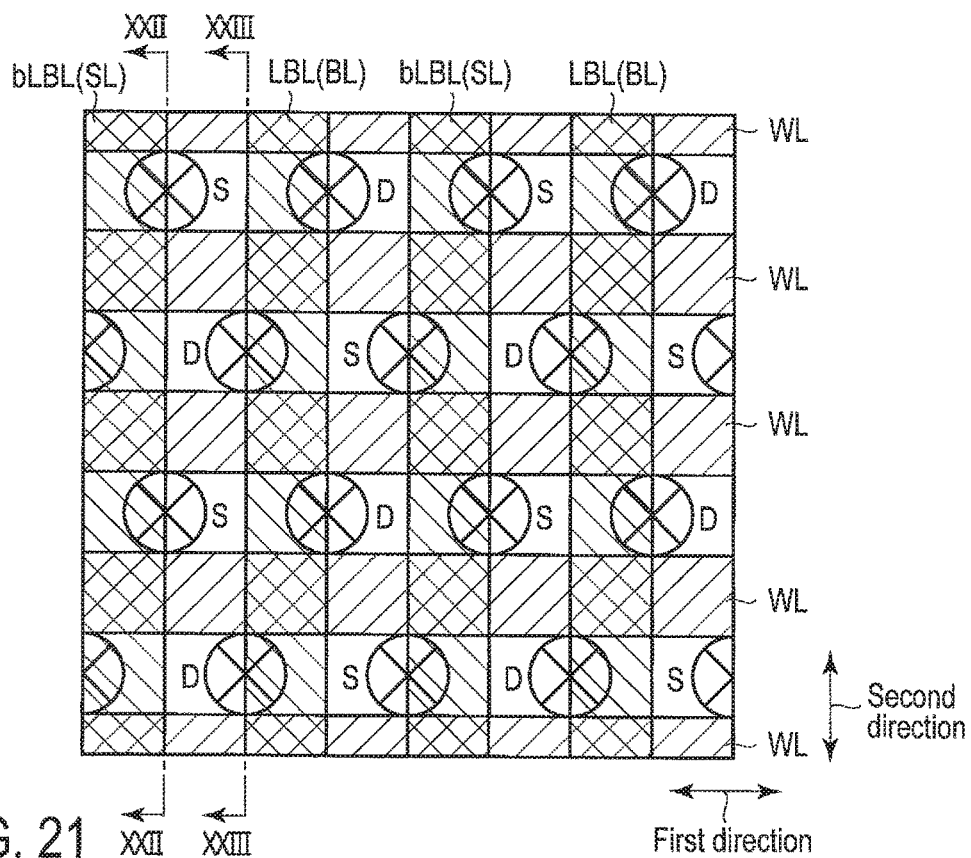
FIG. 21 is a plan view showing an example of areas AA, BB, and CC of FIGS. 20A and 20B.

FIGS. 20A and 20B show a device as a second embodiment. FIG. 21 is a plan view of areas AA, BB, and CC of FIGS. 20A and 20B.

The second embodiment has the feature in the point that, as compared to the comparative example (FIGS. 6 and 7), the thickness of local bit line bLBL (source line SL) is gradually increased as it is separated from the driver 14' in the second direction in which local bit lines LBL (bit lines BL) and local bit lines bLBL (source lines SL) extend.

That is, local bit line bLBL (source line SL) comprises a first portion having a first thickness and a second portion having a second thickness which is greater than the first thickness.

Since the other parts are the same as those of the comparative example, the same reference numbers are assigned to elements which are the same as those of the comparative example, and detailed explanation of them is omitted.

In the comparative example, the reason for having variations in the read/write current during a read/write is that the source potential of the select transistor is varied according to the position of the memory cell.

Hence, in the second embodiment, by gradually increasing the thickness of local bit line bLBL (source line SL) as it is separated from the driver 14' which drives local bit line bLBL (source line SL), the resistance of local bit line bLBL (source line SL) can be reduced.

Because of this, since variations in source potential Vs of select transistor T are reduced, read errors and write errors, etc., can be effectively prevented.

Figure 22A:
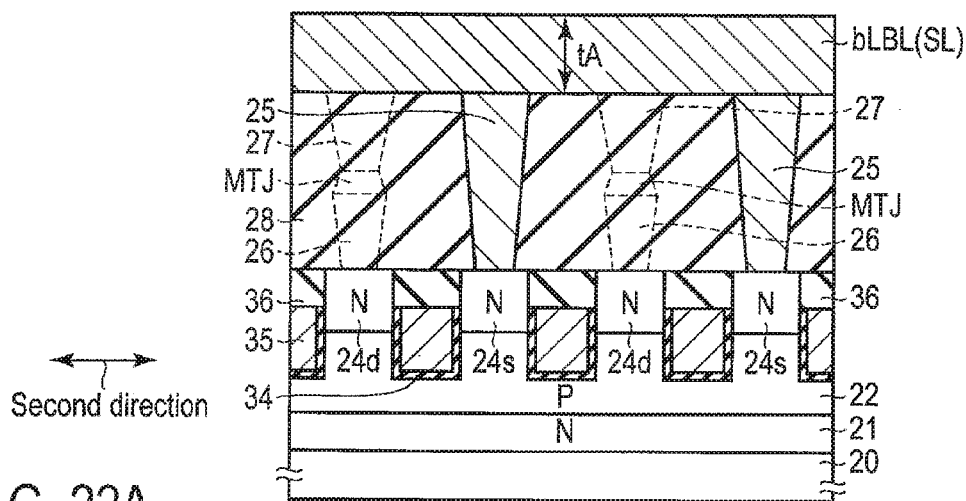
FIGS. 22A, 22B, and 22C are sectional views taken along line XXII-XXII of FIG. 21.
Figure 22B:
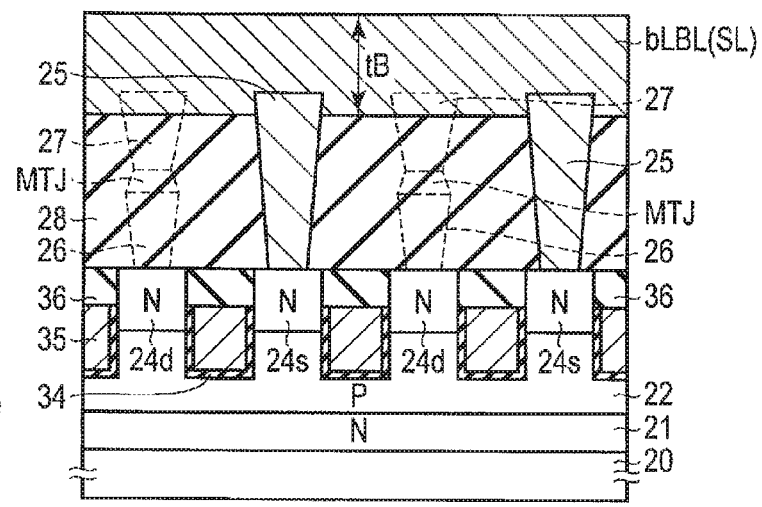

For example, FIG. 22A is a sectional view taken along line XXII-XXII of FIG. 21 as a plan view of area AA of FIGS. 20A and 20B. Further, FIG. 22B is a sectional view taken along line XXII-XXII of FIG. 21 as a plan view of area BB of FIGS. 20A and 20B. Furthermore, FIG. 22C is a sectional view taken along line XXII-XXII of FIG. 21 as a plan view of area CC of FIGS. 20A and 20B.

Figure 22C:
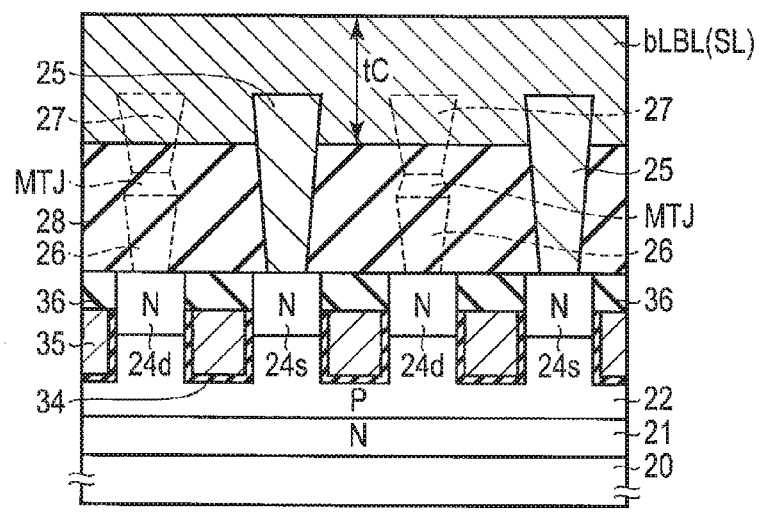

As is clear from FIGS. 22A, 22B, and 22C, in area A (an area that is closest to the driver 14') of FIGS. 20A and 20B, local bit line bLBL (source line SL has thickness tA. Further, in area B of FIGS. 20A and 20B, local bit line bLBL (source line SL) has thickness tB. Furthermore, in area C (an area that is farthest from the driver 14') of FIGS. 20A and 20B, local bit line bLBL (source line SL) has thickness tC. However, the relationship of the thicknesses is tA<tB<tC.

Here, the thickness of the local bit line LBL (bit line BL) may also be gradually increased as it is separated from the sense amplifier 13.

Figure 23A:
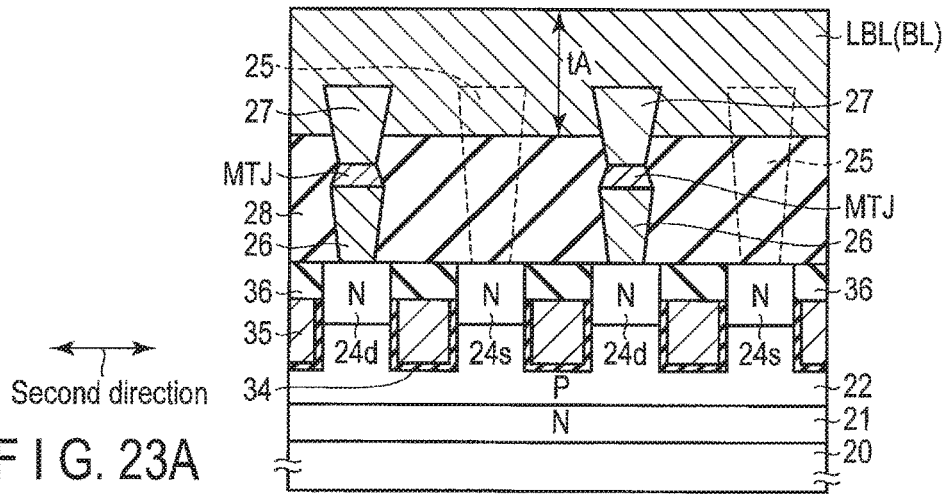
FIGS. 23A, 23B, and 23C are sectional views taken along line XXIII-XXIII of FIG. 21.
Figure 23B:
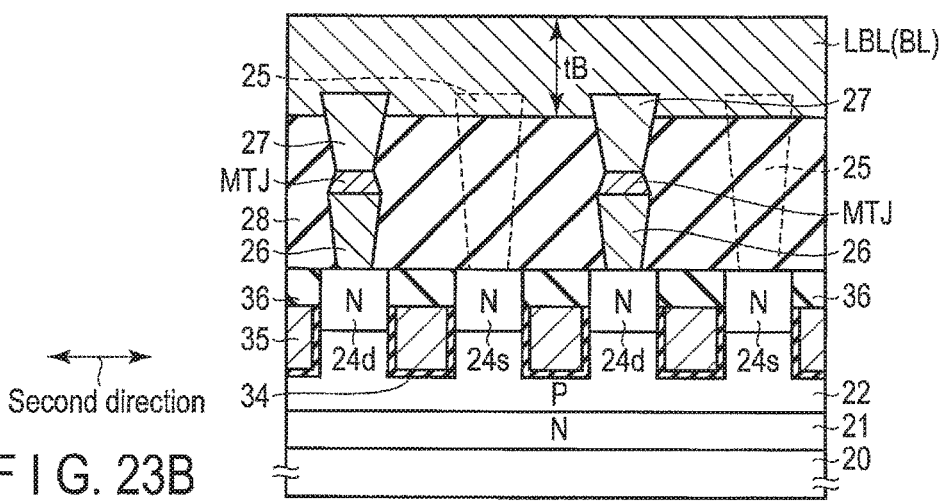

For example, FIG. 23A is a sectional view taken along line XXIII-XXIII of FIG. 21 as a plan view of area AA of FIG. 20A. Further, FIG. 23B is a sectional view taken along line XXIII-XXIII of FIG. 21 as a plan view of area BB of FIG. 20A. Furthermore, FIG. 23C is a sectional view taken along line XXIII-XXIII of FIG. 21 as a plan view of area CC of FIG. 20A.

Figure 23C:
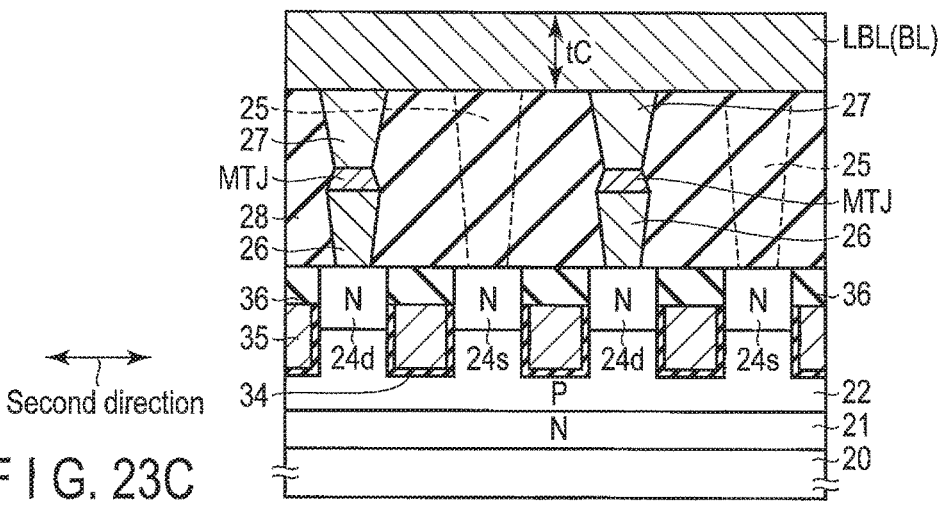

As is clear from FIGS. 23A, 23B, and 23C, in area A (an area that is farthest from the sense amplifier 13) of FIG. 20A, local bit line LBL (bit line BL) has thickness tA. Further, in area B of FIG. 20A, local bit line LBL (bit line BL) has thickness tB.

Furthermore, in area C (an area that is closest to the sense amplifier 13) of FIG. 20A, local bit line B (bit line BL) has thickness tC. However, the relationship of the thicknesses is tA>tB>tC.

Local bit line LBL (bit line BL) having multiple thicknesses or local bit line bLBL (source line SL) having multiple thicknesses as described above can be easily manufactured by performing lithography several times in forming local bit line LBL (bit line BL) and local bit line bLBL (source line SL).

However, in the example of FIG. 20A, the direction in which the thickness of local bit line LBL (bit line BL) is gradually increased and the direction in which the thickness of local bit line bLBL (source line SL) is gradually increased are opposite to each other.

In this case, a lithography step of local bit line LBL (bit line BL) or local bit line bLBL (source line SL) becomes complicated.

Accordingly, as shown in FIG. 20B, for example, the edge on the side of the sense amplifier 13 of local bit line LBL (bit line BL) should preferably be made to accord with the edge on the side of the driver 14' of local bit line bLBL (source line SL).

This is because with the layout of FIG. 20B, the direction in which the thickness of local bit line LBL (bit line BL) is gradually increased becomes the same as the direction in which the thickness of local bit line bLBL (source line SL) is gradually increased. In this way, commonality can be achieved for the lithography step of local bit line LBL (bit line BL) and the lithography step of local bit line bLBL (source line SL).

For example, FIG. 24A is a sectional view taken along line XXIII-XXIII of FIG. 21 as a plan view of area AA of FIG. 20B. Further, FIG. 24B is a sectional view taken along line XXIII-XXIII of FIG. 21 as a plan view of area BB of FIG. 20B. Furthermore, FIG. 24C is a sectional view taken along line XXIII-XXIII of FIG. 21 as a plan view of area CC of FIG. 20B.

As is clear from FIGS. 24A, 24B, and 24C, in area A (an area that is closest to the sense amplifier 13) of FIG. 20B, local bit line LBL (bit line BL) has thickness tA. Further, in area 2 of FIG. 20B, local bit line LBL (bit line BL) has thickness tB. Furthermore, in area C (an area that is farthest from the sense amplifier 13) of FIG. 20B, local bit line LBL (bit line BL) has thickness tC. However, the relationship of the thicknesses is tA<tB<tC.

The relationship of the thicknesses of local bit line LBL (bit line BL) of this case is the same as the relationship of the thicknesses (tA<tB<tC) of local bit line bLBL (source line SL) shown in FIGS. 22A, 22B, and 22C.

According to the second embodiment, a phenomenon in which variations occur in the read/write current that a select transistor can pass can be restrained by changing the thickness of local bit line LBL (bit line BL) or local bit line bLBL (source line SL). Accordingly, read errors and write errors, etc., can be prevented.

(5) Third Embodiment

Figure 25:
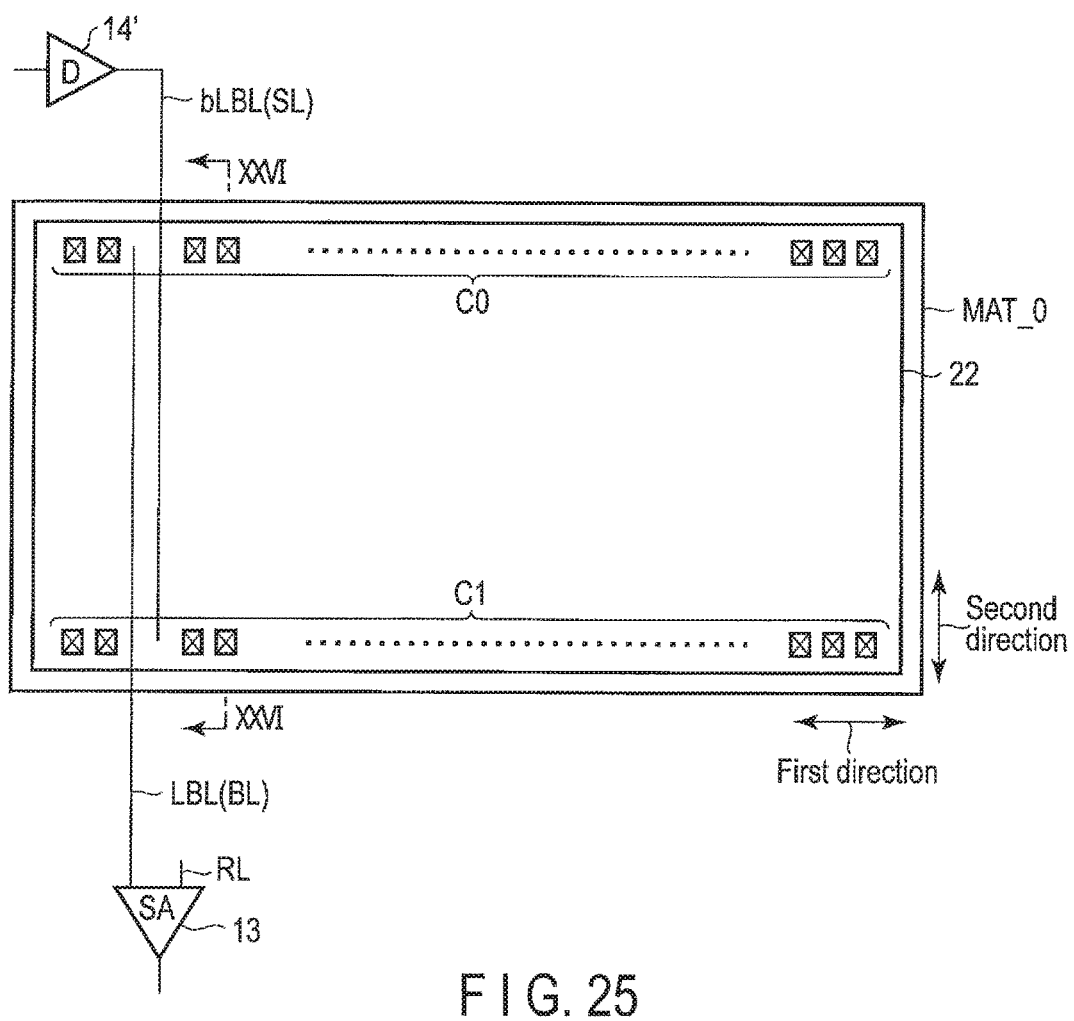
FIG. 25 is a plan view showing a device as a third embodiment.

FIG. 25 shows a device as a third embodiment. FIG. 26 is a sectional view taken along line XXVI-XXVI of FIG. 25.

The third embodiment has the feature in the point that, as compared to the comparative example (FIGS. 6 and 7), a potential gradient is provided in the P-type well region 22 in which select transistor (for example, an FET) T of the memory cell is disposed in the second direction in which local bit lines LBL (bit lines BL) and local bit lines bLBL (source lines SL) extend.

That is, in a read operation using the sense amplifier 13, when the driver 14' applies ground potential Vss to an end of local bit lines bLBL (source lines SL), a first contact C0 which applies a first potential is arranged at an edge portion which is closer to the driver 14' in the second direction within the P-type well region 22, and a second contact C1 which applies a second potential lower than the first potential is arranged at an edge portion which is farther from the driver 14' in the second direction within the P-type well region 22.

For example, when the first potential is the ground potential Vss, the second potential is a negative potential (for example, −1V).

In this case, a potential of the P-type well region 22 is gradually changed from the first potential to the second potential in the direction of proceeding to the second contact C1 from the first contact C0.

This means that the far select transistor T is from the driver 14', that is, the higher the source potential of select transistor T becomes, the greater the absolute value of a back-gate bias of select transistor T (a negative potential when select transistor T is an N-channel FET) becomes gradually.

Accordingly, the back-gate bias of the select transistor can compensate for a decrease of the read/write current caused by the increase in the source potential of the select transistor. In this way, even if variations in the source potential of select transistor T occur, read errors and write errors, etc., can be effectively prevented.

Since the other parts are the same as those of the comparative example, the same reference numbers are assigned to elements which are the same as those of the comparative example, and detailed explanation of them is omitted.

According to the third embodiment, a phenomenon in which variations occur in the read/write current that a select transistor can pass can be restrained by changing the back-gate bias of the select transistor. Accordingly, read errors and write errors, etc., can be prevented.

(6) Fourth Embodiment

Figures 27, 28:
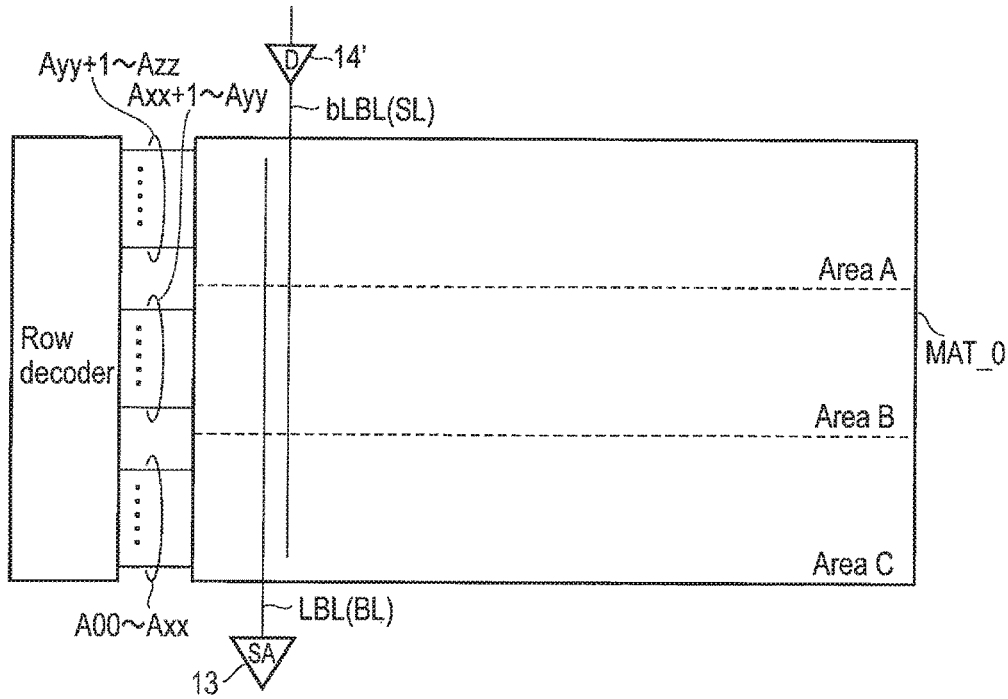
FIG. 27 is a plan view showing a device as a fourth embodiment.
FIG. 28 is a table showing an example of read/write potentials applied to a selected word line.

FIG. 27 shows a device as a fourth embodiment. FIG. 28 shows a read/write potential which is applied to a selected word line during a read/write.

The fourth embodiment has the feature in the point that, as compared to the comparative example (FIGS. 6 and 7), a memory cell is divided into a plurality of areas A, B, and C in the second direction in which local bit lines LBL (bit lines BL) and local bit lines bLBL (source lines SL) extend, and the read/write potential of the selected word line is changed for each of areas A, B, and C.

For example, in a read operation using the sense amplifier 13, a case where the driver 14' applies ground potential Vss to an end of local bit line bLBL (source line SL) is assumed.

In this case, when a selected word line exists in area A (address Ayy+1-Azz) which is closest to the driver 14', the read and write potentials to be applied to the selected word line are set at Vr2 and Vw2, respectively. Further, when a selected word line exists in area B (address Axx+1-Ayy), the read and write potentials to be applied to the selected word line are set at Vr1 and Vw1, respectively. Furthermore, when a selected word line exists in area C (address A00-Axx) which is farthest from the driver 14', the read and write potentials to be applied to the selected word line are set at Vr0 and Vw0, respectively. However, the relationship of the potentials is Vr0>Vr1>Vr2, and also Vw0>Vw1>Vw2.

As can be seen, gradually increasing the gate potential of the select transistor as it is separated from the driver 14' can compensate for the decrease of the read/write current caused by the driver 14' being separated from the select transistor, that is, by the increase in the source potential of the select transistor. In this way, even if variations in the source potential of select transistor T occur, read errors and write errors, etc., can be effectively prevented.

Since the other parts are the same as those of the comparative example, the same reference numbers are assigned to elements which are the same as those of the comparative example, and detailed explanation of them is omitted.

According to the fourth embodiment, a phenomenon in which variations occur in the read/write current that a select transistor can pass can be restrained by changing the gate potential of the select transistor according to the position of the select transistor. Accordingly, read errors and write errors, etc., can be prevented.

Application Example

The resistance change memory according to the aforementioned embodiments can be applied to an STT-MRAM (magnetic random-access memory). In the following, the STT-MRAM will be described.

A processor used for a personal digital assistant is required to be of low power consumption. As one way of reducing power consumption of a processor, one method which can be adopted is to replace a static random access memory (SRAM)-based cache memory having high standby power with an STT-MRAM.

That is, in accordance with miniaturization of a transistor, in an SRAM, leakage power tends to be greater in both the operating time and the standby (non-operating) time. Accordingly, by using an STT-MRAM as a cache memory, it becomes possible to interrupt power during standby, and a low power consumption processor system in which power consumption during standby is very small can be realized.

Figure 29:
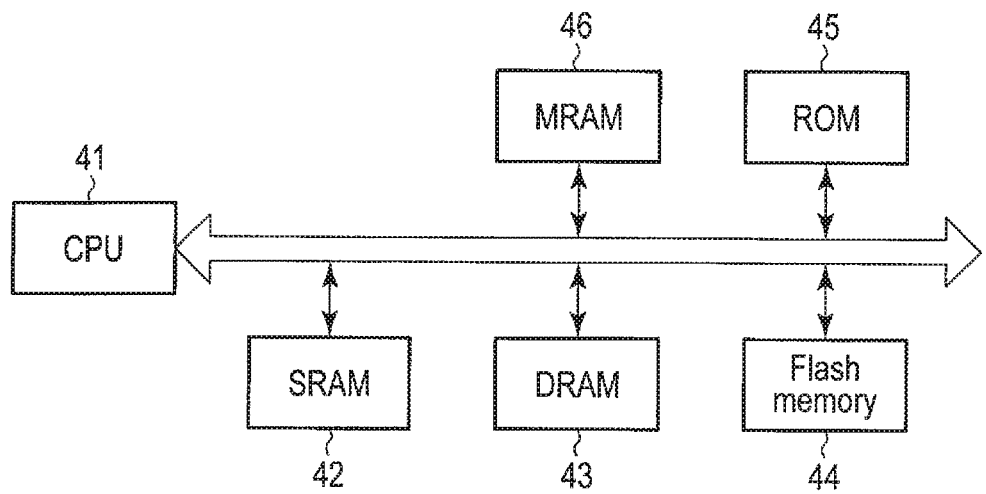
FIG. 29 is a diagram showing an example of a processor system.

FIG. 29 shows an example of a low power consumption processor system.

A CPU 41 controls an SRAM 42, a DRAM 43, a flash memory 44, a ROM 45, and an MRAM 46.

The MRAM 46 corresponds to the resistance change memory according to the aforementioned embodiments.

The MRAM 46 can be used as a substitute for the SRAM 42, the DRAM 43, the flash memory 44, and the ROM 45. Accordingly, at least one of the SRAM 42, the DRAM 43, the flash memory 44, and the ROM 45 may be omitted.

The MRAM 46 is used as a nonvolatile cache memory (for example, an L2 cache).

Figure 30:
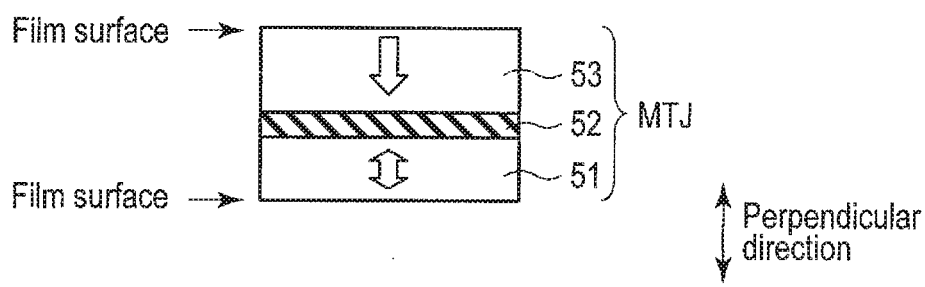
FIGS. 30 and 31 are sectional views showing an example of a magnetoresistive element.

FIG. 30 shows an example of a magnetoresistive element as a memory cell of an MRAM.

A magnetoresistive element MTJ has a laminated structure in which a storage layer (a ferromagnetic layer) 51 having perpendicular and variable magnetization, a tunnel barrier layer (a nonmagnetic layer) 52, and a reference layer (a ferromagnetic layer) 53 having perpendicular and invariable magnetization are arranged in this order in the direction perpendicular to a film surface (i.e., a perpendicular direction).

Here, the invariable magnetization means that the direction of magnetization does not change before and after writing, and the variable magnetization means that the direction of magnetization may be changed to the opposite direction before and after the writing.

Further, the writing means spin transfer writing in which a spin torque is applied to the magnetization of the storage layer 51 by passing a write current (a spin-polarized electron) to the magnetoresistive element MTJ.

For example, when a write current is passed from the storage layer 51 toward the reference layer 53, an electron which is spin-polarized in the same direction as the magnetization of the reference layer 53 is injected into the storage layer 51, and a spin torque is applied to the magnetization in the storage layer 51. Therefore, the direction of magnetization of the storage layer 51 becomes the same as the direction of magnetization of the reference layer 53 (i.e., the parallel state).

Further, when a write current is passed from the reference layer 53 toward the storage layer 51, an electron which is spin-polarized in the direction opposite to the magnetization of the reference layer 53, of electrons proceeding to the reference layer 53 from the storage layer 51, is returned to the storage layer 51, and a spin torque is applied to the magnetization in the storage layer 51. Therefore, the direction of magnetization of the storage layer 51 becomes opposite to the direction of magnetization of the reference layer 53 (i.e., the antiparallel state).

The resistance of the magnetoresistive element MTJ varies depending on the relative directions of magnetization of the storage layer 53 and the reference layer 51 by the magnetoresistive effect. That is, the resistance of the magnetoresistive element MTJ is low in the parallel state, and high in the antiparallel state.

The storage layer 51 and the reference layer 53 comprise, for example, CoFeB, MgFeO, FeB, lamination of them, etc. In the case of the magnetoresistive elements having vertical magnetization, the storage layer 51 and the reference layer 53 should preferably comprise TbCoFe having a perpendicular magnetic anisotropy, an artificial lattice in which Co and Pt are stacked, FePt regularized by $L_{1o}$ or the like. In this case, CoFeB or FeB may be provided as interface layers between the storage layer 51 and the tunnel barrier layer 52 and between the tunnel barrier layer 52 and the reference layer 53.

For example, it is preferable that the storage layer 51 includes CoFeB or FeB, and the reference layer 53 includes CoPt, CoNi, or CoPd.

The tunnel barrier layer 52 comprises, for example, MgO, AlO, and the like. The tunnel barrier layer 52 may be an oxide of Al, Si, Be, Mg, Ca, Sr, Ba, Sc, Y, La, Zr, Hf, etc. When MgO is used for the tunnel barrier layer 52, due to a constraint on the resistance, the thickness is set to be approximately 1 nm.

It should be noted that while the magnetization of the reference layer 53 is fixed to be directed toward the storage layer 51 in this case, it may be fixed to be directed away from the storage layer 51. Further, in arranging the magnetoresistive element MTJ on the semiconductor substrate, which of the reference layer 53 and the storage layer 51 should come at the top is not particularly limited.

For example, when the reference layer 53 is arranged above the storage layer 51, the magnetoresistive element MTJ is called a top-pin type, and when the reference layer 53 is arranged below the storage layer 51, the magnetoresistive element MTJ is called a bottom-pin type.

Figure 31:
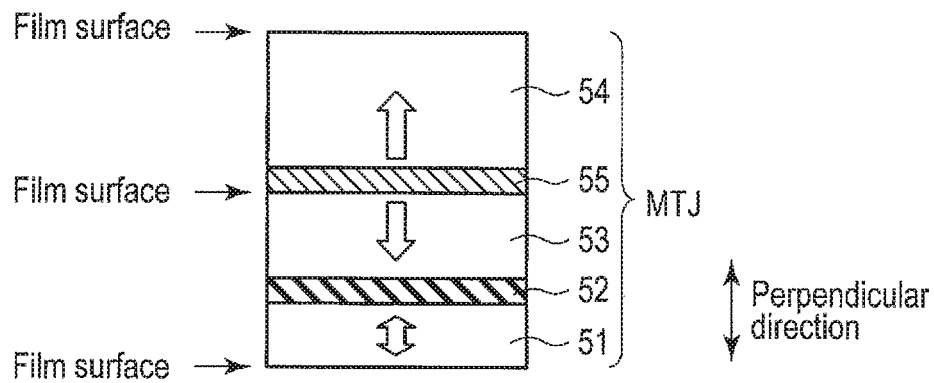

FIG. 31 shows an example of a magnetoresistive element having a shift canceling layer.

The magnetoresistive element MTJ has a laminated structure in which the storage layer (the ferromagnetic layer) 51 having perpendicular and variable magnetization, the tunnel barrier layer (the nonmagnetic layer) 52, and the reference layer (the ferromagnetic layer) 53 having perpendicular and invariable magnetization are arranged in this order in the perpendicular direction.

Also, the magnetoresistive element MTJ comprises a shift canceling layer (a ferromagnetic layer) 54 having perpendicular and invariable magnetization on the side of the reference layer 53. A nonmagnetic layer (for example, a metal layer) 55 is arranged between the reference layer 53 and the shift canceling layer 54.

In the present case, the reference layer 53 and the storage layer 51 have perpendicular magnetization. In this case, since a stray magnetic field from the reference layer 53 conforms to the direction of magnetization of the storage layer 51 (the perpendicular direction), a stray magnetic field having a large perpendicular component is applied to the storage layer 51. This stray magnetic field has the function of making the direction of magnetization of the storage layer 51 the same as the direction of magnetization of the reference layer 53 (so that the parallel state is obtained).

Accordingly, a hysteresis curve (the magnetization reversal property) of the storage layer 51 is shifted.

That is, although it is sufficient to pass a small write current to the magnetoresistive element MTJ when changing the state of the magnetoresistive element MTJ from the antiparallel state to the parallel state, in the case of changing the state of the magnetoresistive element MTJ from the parallel state to the antiparallel state, a large write current must be passed to the magnetoresistive element MTJ.

Also, the antiparallel state is unstable because of the stray magnetic field from the reference layer 53.

That is, when the stray magnetic field becomes greater than a coercivity of the storage layer 51, the storage layer 51 cannot retain the antiparallel state. Also, even if the stray magnetic field is smaller than the coercivity of the storage layer 51, considering fluctuations of the magnetization caused by thermal agitation, the magnetization of the storage layer 51 may be reversed by the stray magnetic field from the antiparallel state to the parallel state.

The shift canceling layer 54 is provided to resolve such a problem.

In the present case, the reference layer 53 and the shift canceling layer 54 are laid over one another. In this case, the direction of magnetization of the shift canceling layer 54 is set to be opposite to the direction of magnetization of the reference layer 53. In this way, in the storage layer 51, a stray magnetic field from the reference layer 53 is offset by a canceling magnetic field from the shift canceling layer 54, and the shift of the hysteresis curve of the storage layer 51 can be canceled.

The shift canceling layer 54 is a magnetic layer like the storage layer 51 and the reference layer 53, and has a direction of magnetization opposite to that of the reference layer 53. The shift canceling layer 54 thus cancels a shift of magnetization reversal characteristic (hysteresis curve) of the storage layer 51 due to a stray magnetic field from the reference layer 53. For example, it is preferable that the shift canceling layer 54 includes CoPt, CoNi, or CoPd. For example, the shift canceling layer 54 comprises a [Co/Pt]n structure obtained by laminating n Co layers and n Pt layers.

The nonmagnetic layer 55 functions as a buffer layer that separates the reference layer 53 and the shift canceling layer 54. The nonmagnetic layer 55 comprises, for example, a metal layer of Pt, W, Ta, Ru or the like.

CONCLUSION

As described above, according to the present embodiments, since a phenomenon in which variations occur in the read/write current that a select transistor can pass can be restrained, read errors and write errors, etc., can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a semiconductor substrate;
   a transistor having a control terminal, a first terminal and a second terminal, the transistor provided on the semiconductor substrate;
   an insulating layer covering the transistor;
   a first conductive line connected to the first terminal and provided on the insulating layer;
   a second conductive line provided on the insulating layer; and
   a resistance change element connected between the second terminal and the second conductive line,
   wherein the first conductive line has a width greater than a width of the second conductive line in a direction in which the first and second conductive lines are arranged.

2. The memory of claim 1, further comprising:
   a sense amplifier connected to the second conductive line.

3. The memory of claim 2, further comprising:
   a driver connecting the first conductive line to a ground terminal in a read operation using the sense amplifier.

4. The memory of claim 3, further comprising:
   a third conductive line above the first conductive line; and
   a switch element having a first end and a second end, the first end connected to the first conductive line,
   wherein the driver is connected between the second end of the switch element and the third conductive line.

5. The memory of claim 3, further comprising:
   a fourth conductive line above the second conductive line; and
   a switch element connected between the second and fourth conductive lines.

6. The memory of claim 1, wherein
   the control terminal is provided in the semiconductor substrate.

7. The memory of claim 1, wherein
   the resistance change element comprises a first magnetic layer having invariable magnetization, a second magnetic layer having variable magnetization, and a non-magnetic layer provided therebetween.

\* \* \* \* \*